(12) United States Patent
Fukuzumi

(10) Patent No.: US 6,882,564 B2
(45) Date of Patent: Apr. 19, 2005

(54) MAGNETIC MEMORY DEVICE HAVING MAGNETIC CIRCUIT AND METHOD OF MANUFACTURE THEREOF

(75) Inventor: Yoshiaki Fukuzumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/359,151

(22) Filed: Feb. 6, 2003

(65) Prior Publication Data

US 2004/0085809 A1 May 6, 2004

(30) Foreign Application Priority Data

Nov. 5, 2002 (JP) ........................................ 2002-321758

(51) Int. Cl.[7] .................................................. G11C 7/00
(52) U.S. Cl. ........................................ 365/171; 365/173
(58) Field of Search ................................. 365/171, 173

(56) References Cited

U.S. PATENT DOCUMENTS

| | | | |
|---|---|---|---|
| 5,940,319 A | | 8/1999 | Durlam et al. |
| 5,956,267 A | | 9/1999 | Hurst et al. |
| 6,104,633 A | * | 8/2000 | Abraham et al. ............ 365/171 |
| 6,211,090 B1 | * | 4/2001 | Durlam et al. ............... 438/692 |

FOREIGN PATENT DOCUMENTS

| WO | WO 00/10172 | 2/2000 |
|---|---|---|

OTHER PUBLICATIONS

Roy Scheuerlein, et al. "A 10ns Read and Write Non–Volatile Memory Array Using a Magnetic Tunnel Junction and Fet Switch In Each Cell" ISSCC 2000, Session 7/ TD: Emerging Memory & Device Technologies/ Paper TA 7.2, 2000, pp. 128–129.

Masahige Sato, et al. "Spin–Valve–Like Properties of Ferromagnetic Tunnel Junctions" Jpn. J. Appl. Phys. vol. 36, Feb. 15, 1997, pp. L200–L201.

Koichiro Inomata, et al. "Spin–Dependent Tunneling Between a Soft Ferromagnetic Layer and Hard Magnetic Nanosize Particles" Jpn. J. Appl. Phys., vol. 36, Oct. 15, 1997, pp. L1380–L1383.

* cited by examiner

*Primary Examiner*—Vu A. Le
(74) *Attorney, Agent, or Firm*—Oblon, Spivak, McClelland, Maier & Neustadt, P.C.

(57) ABSTRACT

A magnetic memory device includes first and second magnetoresistance elements. The first and second magnetoresistance elements store information and are provided apart from each other in a first direction. A first wiring to apply a magnetic field to the first and second magnetoresistance elements is provided along the first direction. A first magnetic circuit is formed along a side of the first wiring and has a notch in its portion between the first and second magnetoresistance elements.

15 Claims, 26 Drawing Sheets

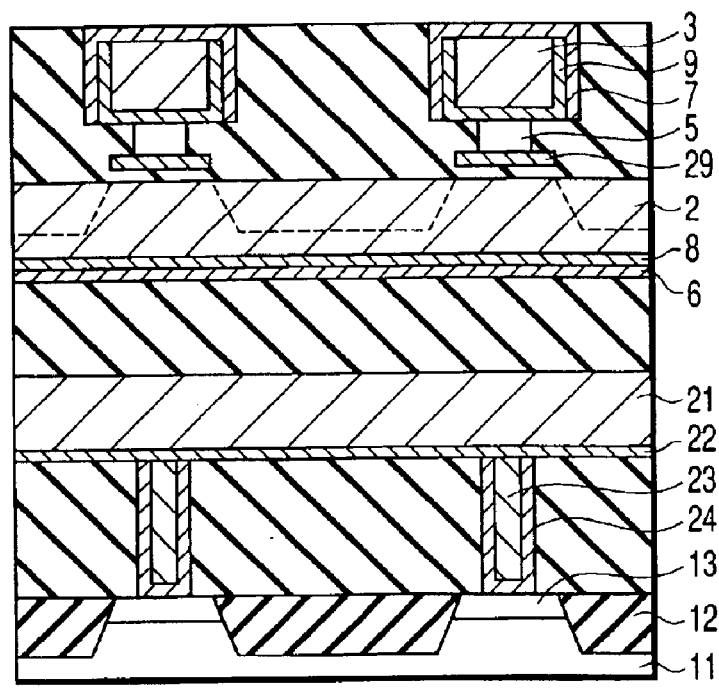
F I G. 3A
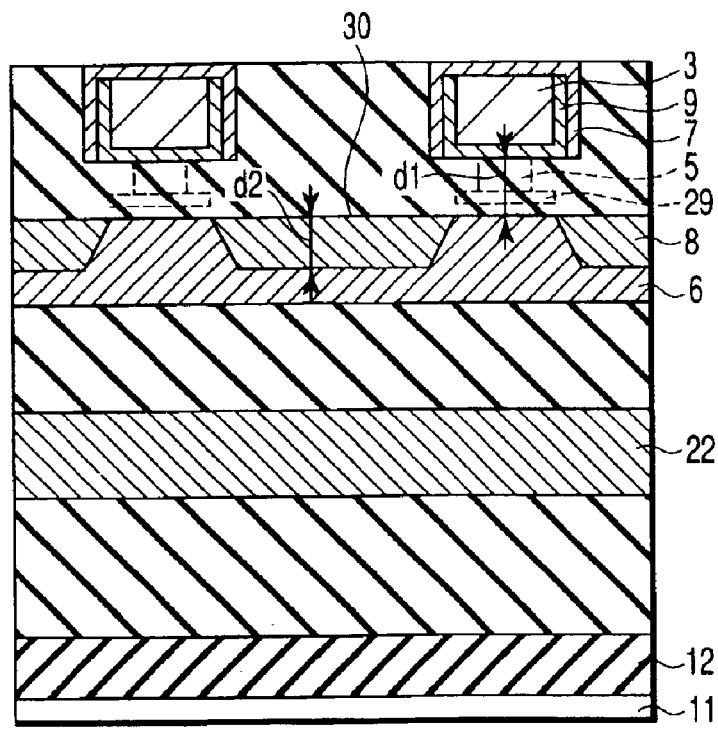
F I G. 3B

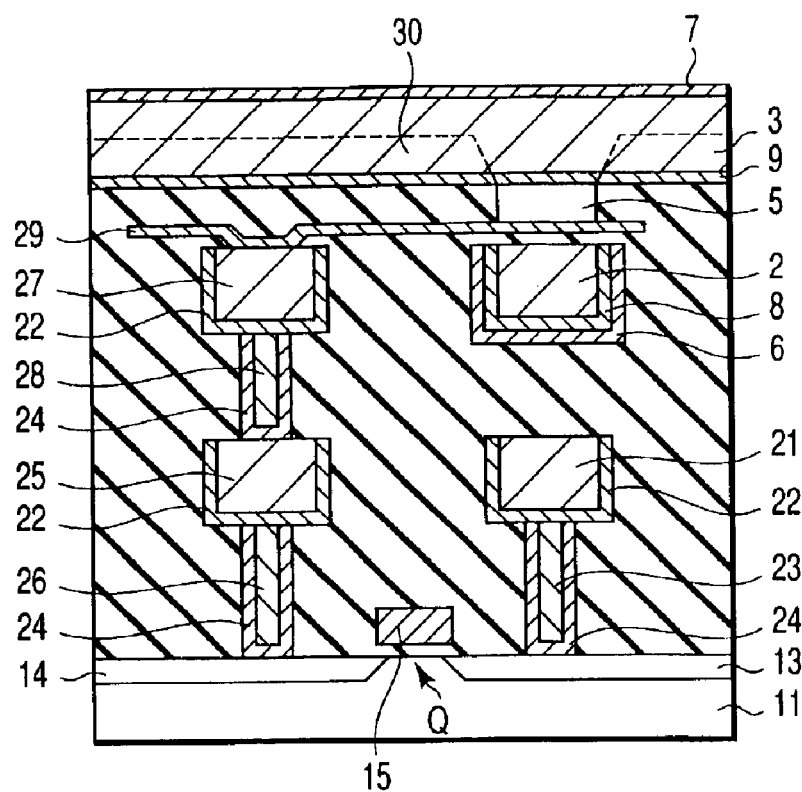
F I G. 20
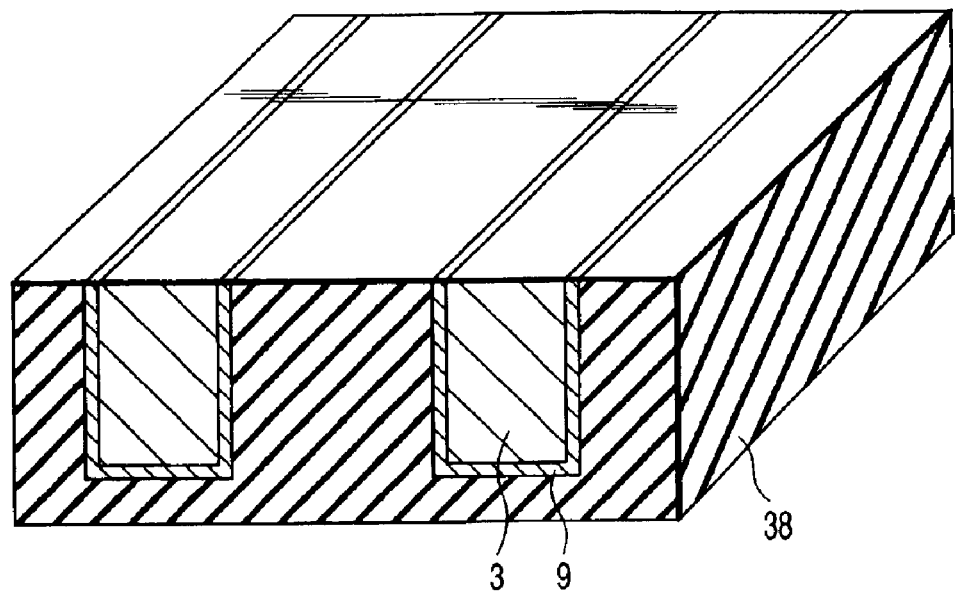
F I G. 21

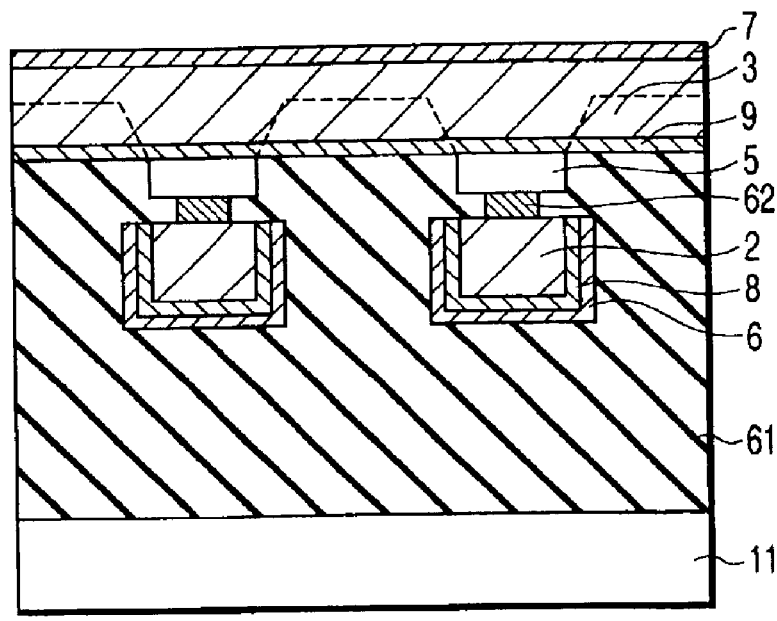
F I G. 28A
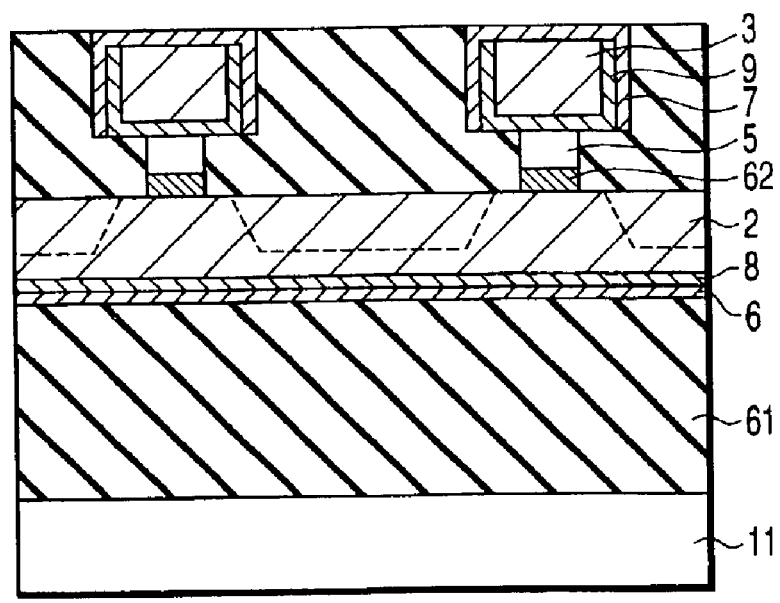
F I G. 28B

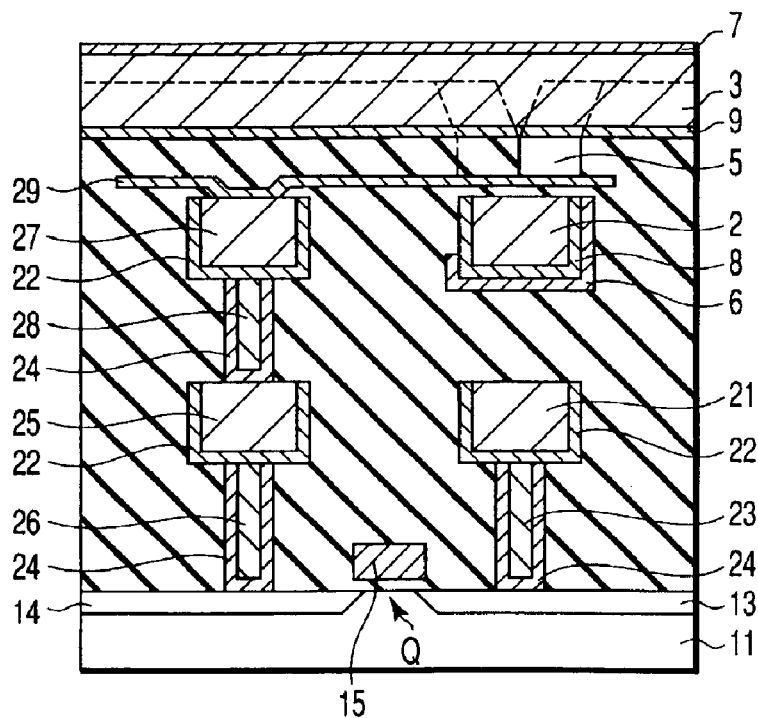
F I G. 38A
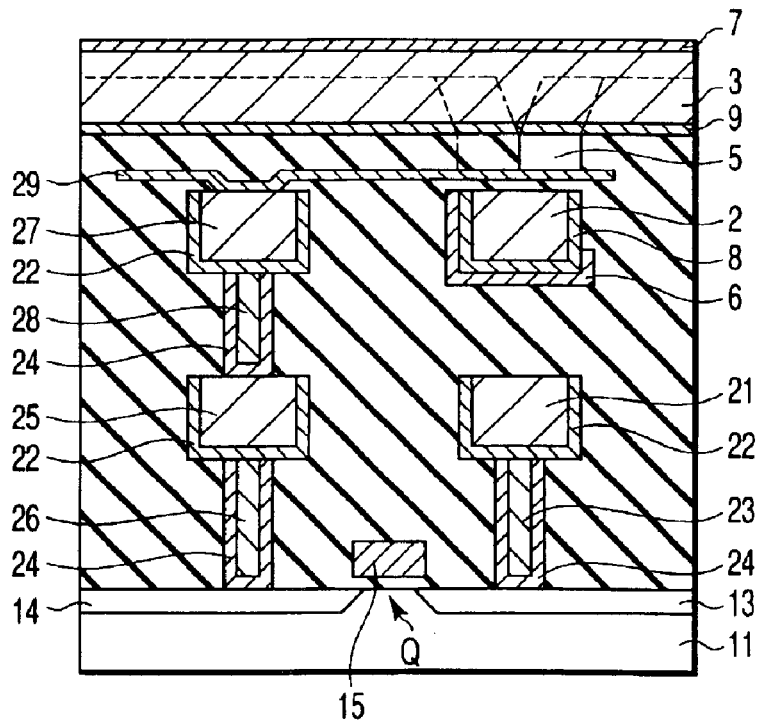
F I G. 38B

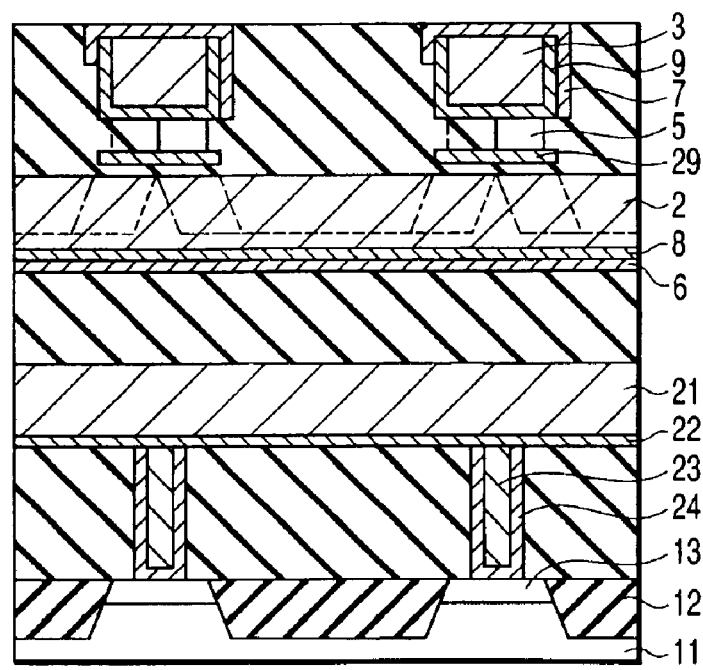
F I G. 39A
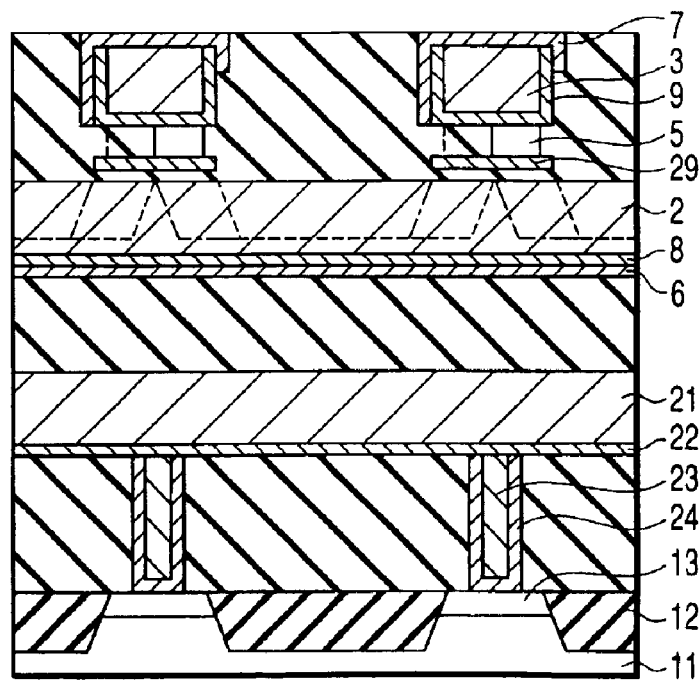
F I G. 39B

MAGNETIC MEMORY DEVICE HAVING MAGNETIC CIRCUIT AND METHOD OF MANUFACTURE THEREOF

CROSS-REFERENCE TO RELATED APPLICATIONS

This application is based upon and claims the benefit of priority from the prior Japanese Patent Application No. 2002-321758, filed Nov. 5, 2002, the entire contents of which are incorporated herein by reference.

BACKGROUND OF THE INVENTION

1. Field of the Invention

The present invention relates to a magnetic memory device and a method of manufacture thereof and more specifically to a magnetic memory device having magnetic circuits and a method of manufacture thereof.

2. Description of the Related Art

Recently, a magnetic memory device utilizing magnetic properties is known. The magnetic memory device stores information utilizing the tunneling magnetoresistance (hereinafter abbreviated as TMR) effect.

As such a magnetic memory device, there is a so-called magnetic random access memory (hereinafter abbreviated as MRAM). The MRAM, which is a generic term for solid memories that utilize the direction of magnetization of ferromagnetic material as information record carrier, can rewrite, hold, or read recorded information as required.

FIGS. 40A and 40B are schematic plan and sectional views, respectively, of a typical magnetic memory device. As shown, a memory cell 203 is placed at each of intersections of first and second write wirings 201 and 202 and between them. The memory cell 203 is formed of a pinned (fixed) layer, a tunnel barrier layer, and a recording layer, which are stacked in the order mentioned.

In writing information into a selected memory cell 203, current is caused to flow in each of the write wiring 201 and 202 associated with that selected memory. As a result, magnetic fields are generated at the intersection of the write wiring 201 and 202 to reverse the direction of magnetization of the recording layer of the memory cell 203. Depending on whether the relative direction of the magnetization of the pinned layer and the recording layer is parallel or antiparallel, binary information is recorded.

Reading of recorded information is effected utilizing the magnetoresistance effect. The magnetoresistance effect is a phenomenon by which the electrical resistance of the memory cell 203 changes with the relative angle between the direction of magnetization of the ferromagnetic material forming the memory cell and current. A change in the resistance is read by flowing current in the memory cell 203.

To write information, it is required to generate a magnetic field (switching magnetic field) needed to reverse the direction of magnetization of the recording layer. Known is providing a keeper layer or yoke structure (magnetic circuit) around the write wirings 201 and 202 in order to generate efficiently that magnetic field with a small amount of current (see U.S. Pat. No. 5,940,319, U.S. Pat. No. 5,956,267, European Patent No. WO 00/10172, and Japanese Unexamined Patent Publication No. 8-306014).

As shown in FIGS. 41A and 41B, around the first write wiring 201 is provided a magnetic circuit 205 made of a magnetic material of high permeability with a barrier metal 204 interposed therebetween. Such a structure allows magnetic flux generated around the write wiring 201 to be converged on the magnetic circuit 205 efficiently. Thus, the current value (write current value) required to generate the switching magnetic field can be reduced. When the magnetic circuit 205 is provided, the intensity of the magnetic field generated in the vicinity of the memory cell 203 depends on the distance between the magnetic circuit and the memory cell. That is, the shorter the distance, the greater the magnetic field generated in the vicinity of the memory cell 203.

As design rules scale down and hence the packing density of magnetic memory devices increases, the difficulties involved in the lithographic process increase. For this reason, variations in the size of memory cells may occur as shown in FIG. 42A. Also, there is a limit to the overlay accuracy; thus, for example, the memory cells 203 may not be aligned with the write wiring 201 as shown in FIG. 43A. The variations in memory cell size and the misalignment of the memory cells 203 with the write wiring 201 result in the following problems:

As shown in FIGS. 42B and 42C which are sectional views taken along lines XLIIB—XLIIB and XLIIC—XLIIC in FIG. 42A, a large memory cell 203b is smaller in the distance to the magnetic circuit 205 than a small memory cell 203a. For this reason, most of magnetic flux 206 generated around the write wiring 201 will converge on the memory cell 203b. On the other hand, the magnetic field in the memory cell 203a becomes small.

As shown in FIGS. 43B and 43C as well, which are sectional views taken along lines XLIIIB—XLIIIB and XLIIIC—XLIIIC in FIG. 43A, the magnetic flux varies between a memory cell 203c and a memory cell 203d.

Thus, the presence of variations in the size of memory cells and displacements of the memory cells cause the applied magnetic flux to vary from cell to cell. This will cause the write current value to vary from cell to cell, resulting in lowered yield of magnetic memory devices.

BRIEF SUMMARY OF THE INVENTION

According to a first aspect of the present invention, there is provided a magnetic memory device comprising: first and second magnetoresistance elements provided apart from each other in a first direction and recording information; a first wiring provided along the first direction and applying a magnetic field to the first and second magnetoresistance elements; and a first magnetic circuit provided along a side of the first wiring, the first magnetic circuit having a notch in its portion between the first and second magnetoresistance elements.

According to a second aspect of the present invention, there is provided a method of manufacture of a magnetic memory device comprising: forming a first wiring along a first direction; forming a first magnetic circuit along a side of the first wiring; forming a first and a second magnetoresistance elements apart from each other on the first wiring; forming a first and second mask layers which cover the first and second magnetoresistance elements, respectively; and removing a portion of the first magnetic circuit using the first and second mask layers as a mask, forming a notch in a portion of the first magnetic circuit that is located between the first and second mask layers.

BRIEF DESCRIPTION OF THE SEVERAL VIEWS OF DRAWING

FIGS. 3A and 3B are schematic sectional views taken along lines IIIA—IIIA and IIIB—IIIB, respectively, of FIG. 1;

FIG. 20 is a schematic sectional view of a magnetic memory device according to a third embodiment of the present invention;

FIGS. 21, 22, 23 and 24 are schematic perspective views, in the order of steps of manufacture, of the magnetic memory device of FIG. 20;

FIGS. 28A and 28B are schematic sectional views taken along lines XXVIIIA—XXVIIIA and XXVIIIB—XXVIIIB, respectively, of FIG. 27;

FIGS. 38A and 38B are schematic sectional views taken along lines XXXVIIIA—XXXVIIIA and XXXVIIIB—XXXVIIIB, respectively, of FIG. 37;

FIGS. 39A and 39B are schematic sectional views taken along lines XXXIXA—XXXIXA and XXXIXB—XXXIXB, respectively, of FIG. 37;

Figure 40A:
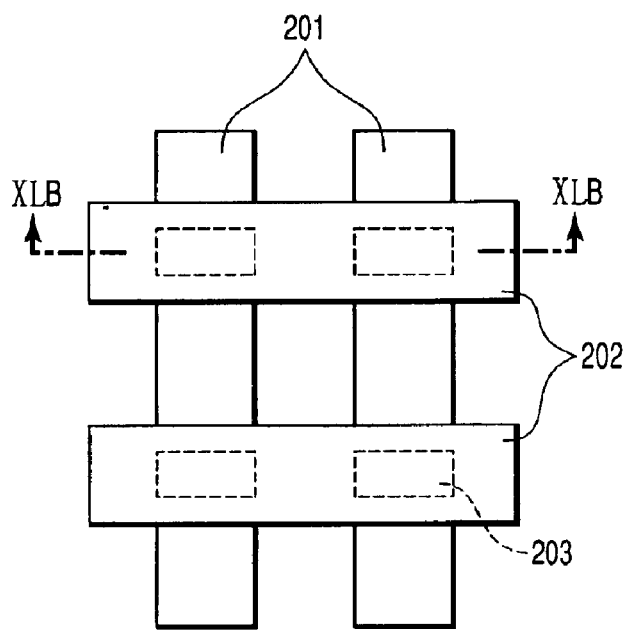
Figure 40B:
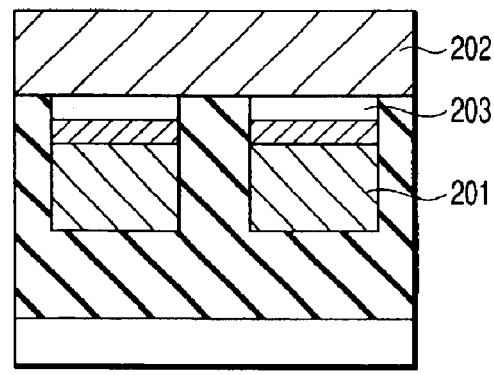
Figure 41A:
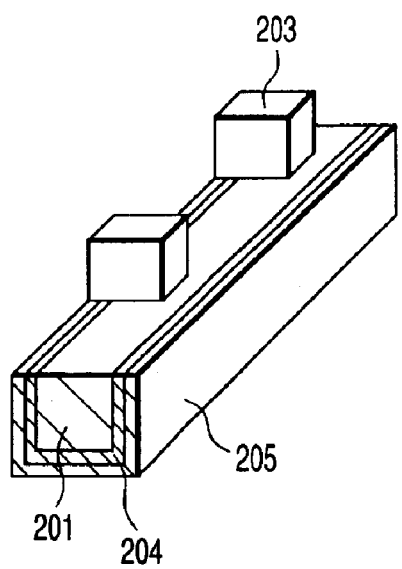
Figure 41B:
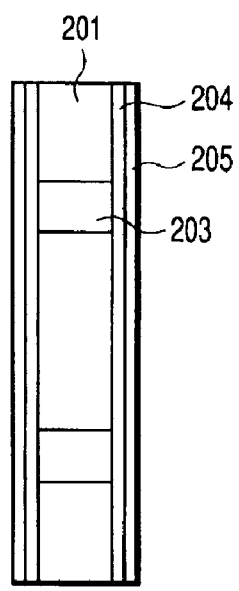
Figure 42A:
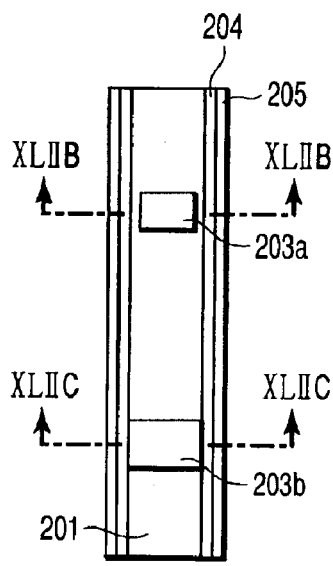
Figure 42B:
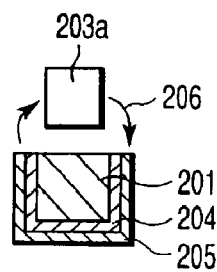
Figure 42C:
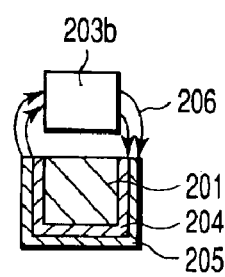
Figure 43A:
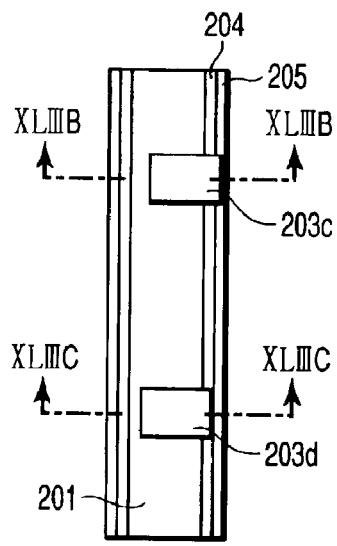
Figure 43B:
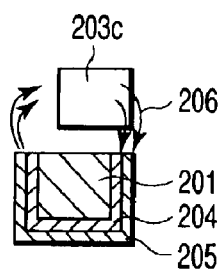
Figure 43C:
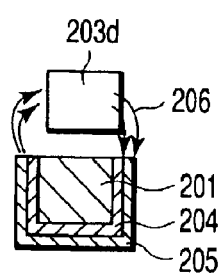
Figure 44:
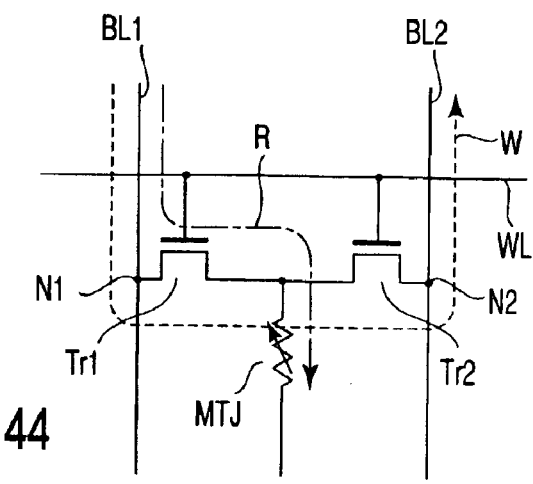

FIGS. 40A and 40B schematically show a typical magnetic memory device;

FIGS. 41A and 41B schematically show a write wiring having a magnetic circuit;

FIGS. 42A, 42B, 42C, 43A, 43B and 43C are diagrams for use in explanation of problems associated with a conventional magnetic memory device; and FIG. 44 is a schematic circuit diagram of a magnetic memory device using a write wiring.

DETAILED DESCRIPTION OF THE INVENTION

The preferred embodiments of the present invention will be described hereinafter with reference to the accompanying drawings. In the description which follows, the same or functionally equivalent elements are denoted by the same or similar reference characters and repeated descriptions thereof are made only when necessary.

First Embodiment

Figure 1:
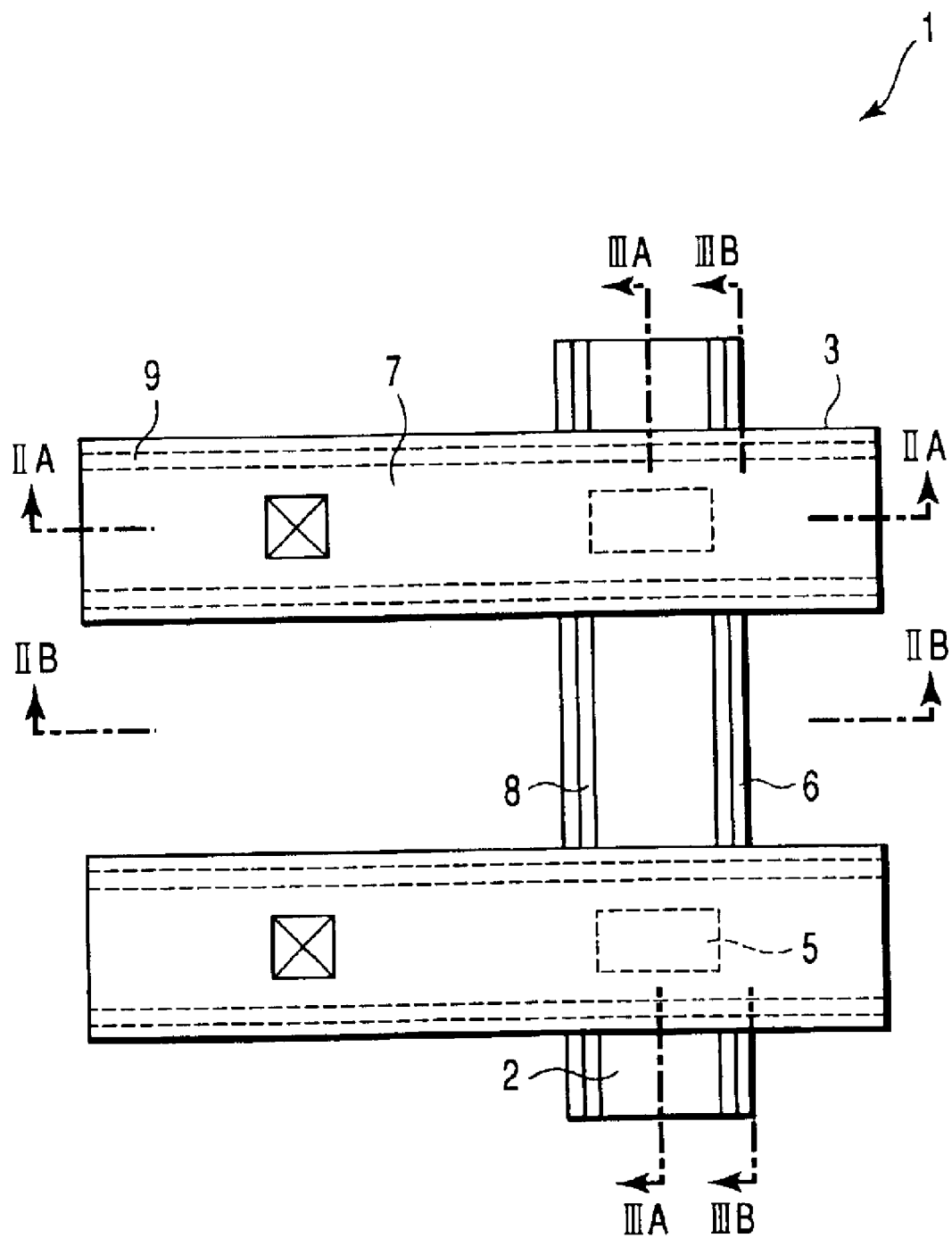
FIG. 1 is a schematic plan view of a magnetic memory device according to a first embodiment of the present invention.

FIG. 1 is a schematic plan view of a magnetic memory device according to a first embodiment of the present invention. The magnetic memory device, generally indicated at 1, is of a type having select transistors. As shown in FIG. 1, first write wirings 2 in the magnetic memory device 1 of the first embodiment are formed along a first direction and have a function of applying a magnetic field to memory cells 5.

Second write wirings 3 are formed in a plane different from the plane in which the first write wirings 2 are formed (in the drawing, a plane above the first write wiring). The second write wiring 3 are formed along a second direction different from the first direction in which the first write wirings 2 are formed. The second write wirings 3 have a function of applying a magnetic field to the memory cells 5 and serve as data lines onto which data are read from the memory cells 5. Typically, the first and second directions are substantially perpendicular to each other. Reference numerals 8 and 9 denote barrier metal.

The memory cell 5 is placed at each of intersections of the first and second write wirings 2 and 3 so that it is sandwiched between the associated first and second write wirings. The surfaces facing substantially the same direction of each memory cell face the first and second write wiring 2 and 3. The memory cell 5 has its side in the direction along the second write wiring 3 formed longer than the side in the direction along the first write wiring 2. Thereby, the direction of magnetization in the memory cell 5 becomes easy to be reversed along the direction of the second write wiring 3. The direction of the second write wiring 3 is called the direction of the axis of easy magnetization.

As the memory cell 5 use is made of a magnetoresistance element that exhibits the magnetoresistance effect. As one of the magnetoresistance elements use, MTJ element having a magnetic tunnel junction (hereinafter abbreviated as MTJ) (see, for example, ISSCC 2000 Digest Paper TA 7.2) is used. The MTJ element, as will be described later, has a structure such that a pinned layer, a recording layer and a tunnel barrier layer are stacked. The pinned and recording layers are each made of a ferromagnetic material and the tunnel barrier layer is formed of an insulating material.

Each of the first write wirings 2 has a magnetic circuit 6 formed around it. Likewise, each of the second write wirings 3 has a magnetic circuit 7 formed around it.

Figure 2A:
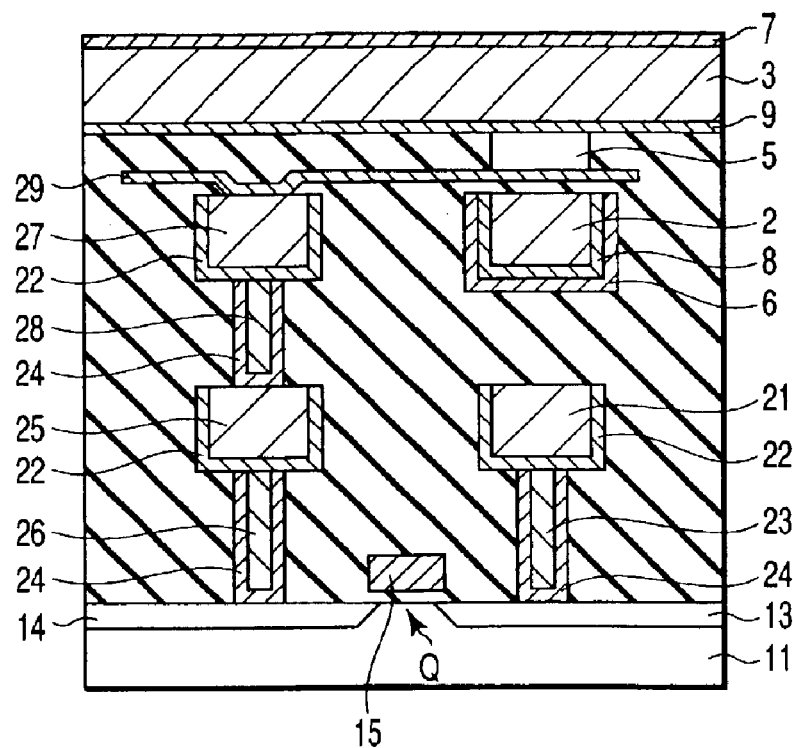
FIGS. 2A and 2B are schematic sectional views taken along lines IIA—IIA and IIB—IIB, respectively, of FIG. 1.
Figure 2B:
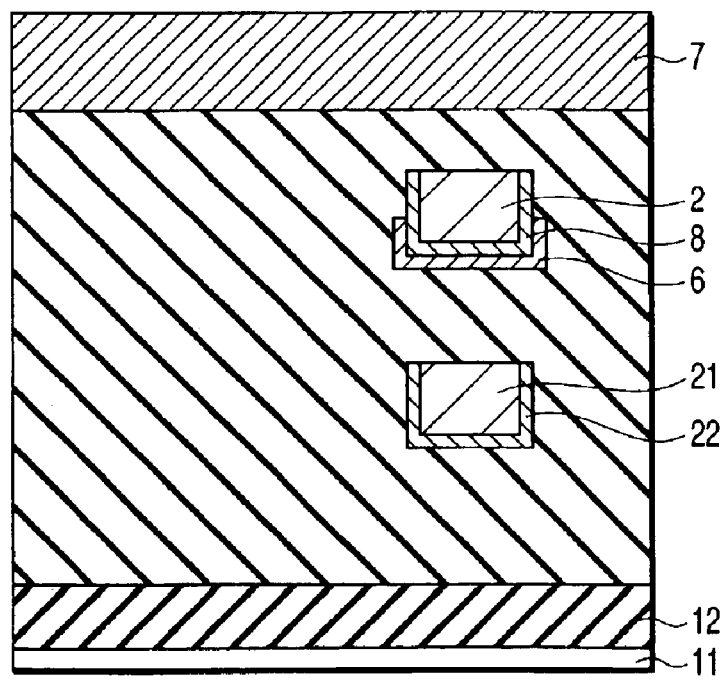

FIGS. 2A, 2B, 3A and 3B are schematic sectional views of the magnetic memory device shown in FIG. 1. More specifically, FIGS. 2A and 2B schematically show sectional structures taken along lines IIA—IIA and IIB—IIB, respectively, of FIG. 1, and FIGS. 3A and 3B schematically show sectional structures taken along lines IIIA—IIIA and IIIB—IIIB, respectively, of FIG. 1.

As shown in FIGS. 2A, 2B, 3A and 3B, a device isolation insulating film 12 is formed on the major surface of a semiconductor substrate 11 and patterned to define transistor formation areas. In each transistor formation area, a MIS (Metal Insulator Semiconductor) transistor Q is formed. The transistor Q is composed of a source diffusion region (source region) 14, a drain region (drain diffusion region) 14, a gate insulating film (not shown), and a gate electrode 15. The source region 13 and the drain region 14 are formed in the surface of the semiconductor substrate 11 with spacing therebetween. The gate electrode 15 is formed over a portion of the semiconductor substrate 11 between the source and drain regions 13 and 14 with the gate insulating film interposed therebetween.

A wiring layer 21 is formed above the source region 13. The wiring layer 21 has a barrier metal 22 of, for example, damascene structure as desired. Likewise, each of wiring layers to be described later is formed with the barrier metal 22 as desired.

The wiring layer 21 and the source region 13 are connected with each other by a plug 23, which is formed on sidewall and underside with a barrier metal 24 of the so-called damascene structure as desired. Likewise, each of plugs to be described later is formed with the barrier metal 24 as desired.

A wiring layer 25 is formed above the drain region 14. The wiring layers 21 and 22 are formed at substantially the same level. A plug 26 connects the wiring layer 25 and the drain region 14. A wiring layer 27 is formed over the wiring layer 25. A plug 28 connects the wiring layers 25 and 27.

A first write wiring 2 is formed over the wiring layer 21. The first write wiring 2 may be formed at substantially the same level as the wiring layer 27. The first write wiring 2 is formed with a barrier metal 8 of the damascene structure. A magnetic circuit 8 may be formed around the barrier metal 8 so that it extends along the sides and underside of the first write wiring 2.

As shown in FIG. 3B, the magnetic circuit 6 has notches 30 formed in its upper portion on the sides of the first write wiring 2. The notches 30 are formed at least between each second write wiring 3. The notches may be formed between each memory cell 5. In FIG. 3B, assuming that the shortest distance between the memory cell 5 and the magnetic circuit 6 is d1 and the depth of the notches 30 is d2, it is desirable that d2>0.5×d1.

A connecting wiring layer 29 is formed over the wiring layer 27 and the first write wiring 2. The connecting wiring layer 29 extends from the wiring layer 27 to over the first write wiring 2. The connecting wiring layer 29 is connected with the wiring layer 27.

A memory cell 5 is formed on the connecting wiring layer 29 so that it is located over the first write wiring 2. A second write wiring 3 is formed on the memory cell 5. A barrier metal 9 of the damascene structure is formed on the sides and underside of the second write wiring 2. Around the barrier metal 9 is formed a magnetic circuit 9 to extend along the sides and top of the second write wiring 3.

It is desirable that the material of the magnetic circuits 6 and 7 has magnetic response characteristics that allow for the pulse duration of a write current used in the magnetic memory device. For this reason, the material should preferably satisfy: (1) the initial permeability is 100 or more; (2) the saturation magnetization is small; and (3) the specific resistivity is high. Thus, the magnetic circuit can be made of a high-permeability material such as permalloy or the like, an Ni-based alloy such as Mo-added permalloy or the like, or an Fe-based alloy such as sendust or FINEMET (a trademark), or the like. It is also possible to use an oxide ferromagnetic material such as ferrite or the like. Further, those materials may be added with a metalloid, such as Si, B, or the like, or an additive agent, such as Cu, Cr, V, or the like, that allows grain boundary precipitates sludge to be produced readily. As a result, the alloy can be made a microcrystal aggregate or amorphous. It is desirable to optimize the shape of the magnetic circuits 6 and 7 so that their magnetic domains are controlled suitably.

Next, the memory cell (MTJ element) 5 will be described. As the MTJ structure of the MTJ element the so-called spin valve structure is known. The spin valve structure is one in which an antiferromagnetic material is placed adjacent to a ferromagnetic material to fix the direction of magnetization (see, for example, Jpn. J. Appl. Phys., 36, L200(1997)). The use of the spin valve structure allows the sensitivity to magnetic fields to be improved.

Figure 4:
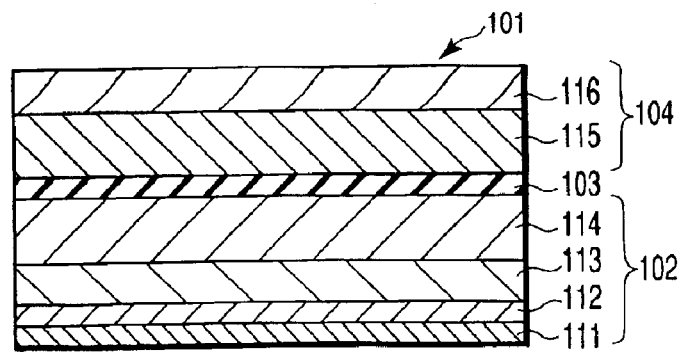
FIGS. 4, 5, 6, 7, 8 and 9 show, in sectional view, examples of memory cell structures.
Figure 5:
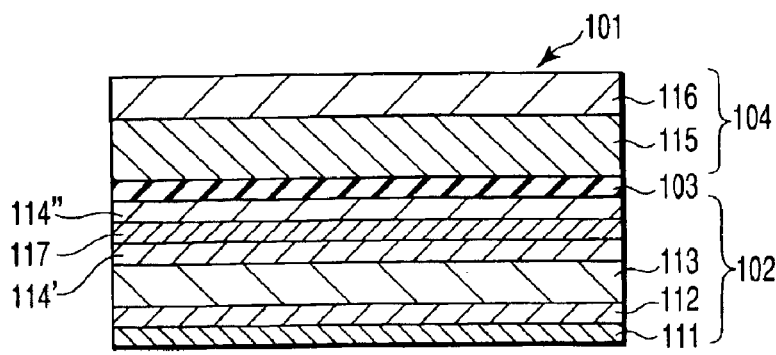
Figure 6:
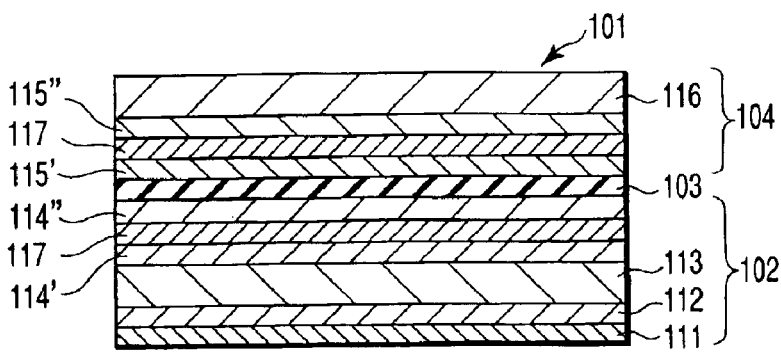

FIGS. 4, 5 and 6 schematically show, in sectional view, examples of memory cells 101 of the spin valve structure. These memory cells 101 have a so-called single tunnel barrier layer structure. That is, each memory cell has a pinned layer 102, a tunnel barrier layer 103, and a recording layer 104, which are stacked in the order mentioned. The structures of the pinned layer 102 and the recording layer 104 will be described below.

The pinned layer 102 of the memory cell 101 shown in FIG. 4 is composed of a template layer 111, an initial ferromagnetic layer 112, an antiferromagnetic layer 113, and a reference ferromagnetic layer 114, which are stacked in the order mentioned. The recording layer 104 has a free ferromagnetic layer 115 and a contact layer 116, which are stacked in the order mentioned.

The memory cell 101 shown in FIG. 5 is structured such that the pinned layer 102 is comprised of more layers than the one shown in FIG. 4. That is, the pinned layer 102 has a template layer 111, an initial ferromagnetic layer 112, an antiferromagnetic layer 113, a ferromagnetic layer 114', a nonmagnetic layer 117, and a ferromagnetic layer 114'', which are stacked in the order mentioned. The recording layer 104 remains unchanged from the one shown in FIG. 4.

The memory cell 101 shown in FIG. 6 is designed such that the recording layer 104 has more layers than the one in FIG. 5. That is, the pinned layer 102 remains unchanged in structure from the one in the memory cell of FIG. 5. On the other hand, the recording layer 104 has a ferromagnetic layer 115', a nonmagnetic layer 117, a ferromagnetic layer 115'', and a contact layer 116. The memory cell structures shown in FIGS. 5 and 6 can suppress the generation of leakage magnetic fields between each layer comprising the memory cell 101 in comparison with the structure of FIG. 4, thus making for fine structures of memory cells.

Each layer of the memory cells shown in FIGS. 4, 5 and 6 can be formed from materials indicated below.

As the materials of the pinned layer 102 and the recording layer 104, Fe, Co, Ni, or their alloys, magnetite of large spin polarizability, or oxides such as $CrO_2$, $RXMnO_{3-y}$ (R: rare earth element, X: Ca, Ba, Sr), etc can be used. Also, Heusler's alloys, such as NiMnSb, PtMnSb, etc., can be used. These ferromagnetic materials are allowed to contain some quantities of non-magnetic elements, such as Ag, Cu, Au, Al, Mg, Si, Bi, Ta, B, C, O, Pd, Pt, Zr, Ir, W, Mo, Nb, etc., unless they lose ferromagnetism.

The materials of the antiferromagnetic layer 113 that forms a part of the pinned layer 102 include Fe—Mn, Pt—Mn, Pt—Cr—Mn, Ni—Mn, Ir—Mn, NiO, and $Fe_2O_3$.

As the materials of the tunnel barrier layer 103, dielectrics, such as $Al_2O_3$, $SiO_2$, MgO, AlN, $Bi_2O_3$, $MgF_2$, $CaF_2$, $SrTiO_2$, $AlLaO_3$, etc can be used. These dielectrics are allowed to contain oxygen, nitrogen, or fluorine depletion.

The memory cell structures shown in FIGS. 4, 5 and 6 are also applicable to other embodiments to be described later.

As the memory cells 5, double tunnel barrier layer structure can be adopted. The double tunnel barrier layer structure has a first pinned layer 122, a first tunnel barrier layer 123, a recording layer 104, a second tunnel barrier layer 125, and a second pinned layer 126, which are stacked in sequence. The double tunnel barrier layer structure can keep high rate of magnetoresistance with respect to applied voltage to the memory cells. The first tunnel barrier layers 123 and 125 can be made from the same materials of the tunnel barrier layer 103 shown in FIGS. 4 to 6.

Figure 7:
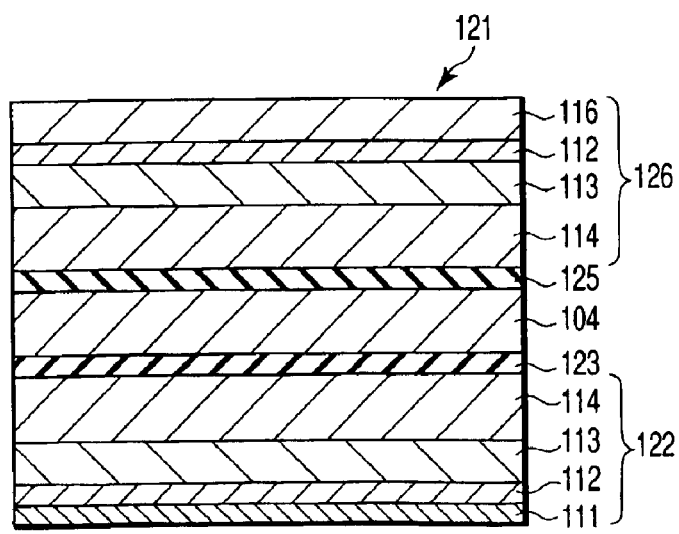
Figure 8:
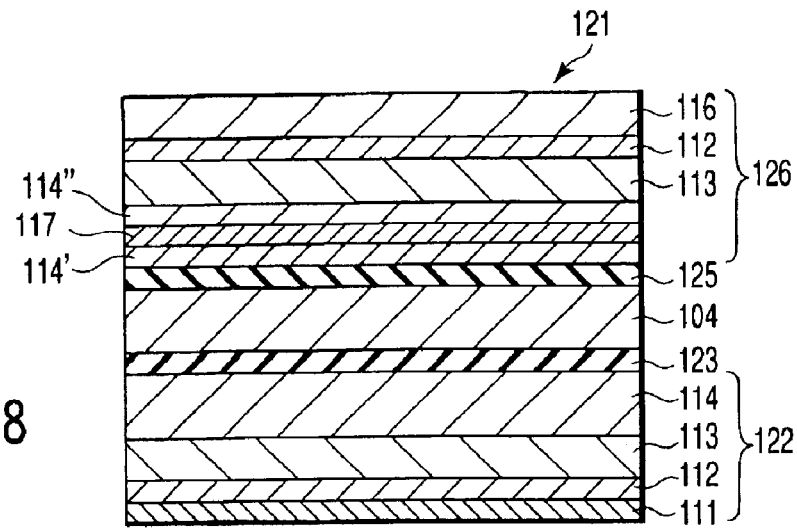
Figure 9:
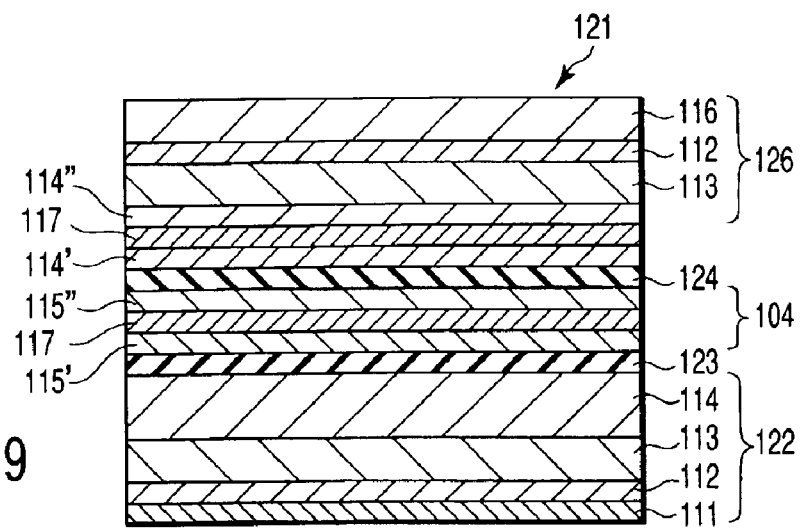

The double tunnel barrier layer structure and the spin valve structure can be used in combination. Memory cells that have the double tunnel barrier layer structure and the spin valve structure will be described hereinafter. FIGS. 7, 8 and 9 are schematic sectional views of exemplary memory cells 121 that have both the double tunnel barrier layer structure and the spin valve structure. The structures of the first pinned layer 122, the recording layer 104 and the second pinned layer 126 will now be described.

The first pinned layer 122 of the memory cell 121 shown in FIG. 7 is composed of a template layer 111, an initial ferromagnetic layer 112, an antiferromagnetic layer 113, and a reference ferromagnetic layer 114, which are stacked in the order mentioned. The second pinned layer 126 has a reference ferromagnetic layer 114, an antiferromagnetic ferromagnetic layer 113, an initial ferromagnetic layer 112, and a contact layer 116, which are stacked in the order mentioned.

The memory cell 121 shown in FIG. 8 is designed such that the second pinned layer 126 has more layers than the one in FIG. 7. That is, the first pinned layer 122 remains unchanged in structure from the one in the memory cell of FIG. 7. On the other hand, the second pinned layer 126 has a ferromagnetic layer 114', a nonmagnetic layer 117, a ferromagnetic layer 114", an antiferromagnetic layer 113, an initial ferromagnetic layer 112, and a contact layer 116.

The memory cell 121 shown in FIG. 9 is designed such that the recording layer 104 has more layers than in the one in FIG. 8. That is, the first and second pinned layers 122 and 126 remain unchanged in structure from those in the memory cell of FIG. 8. On the other hand, the recording layer 104 has a ferromagnetic layer 115', a nonmagnetic layer 117, and a ferromagnetic layer 115". The memory cell structures shown in FIGS. 8 and 9 can suppress the generation of leakage magnetic fields between each layer comprising the memory cell 121 in comparison with the structure of FIG. 7, thus making for fine structures of memory cells.

The memory cell structures shown in FIGS. 7, 8 and 9 are also applicable to other embodiments to be described later.

Next, reference will be made to FIGS. 10A and 10B through 15A and 15B to describe a method of manufacture of the magnetic memory device shown in FIGS. 1, 2A, 2B, 3A and 3B. FIGS. 10A and 10B through 15A and 15B are sectional views, in the order of steps of manufacture, of the magnetic memory device shown in FIGS. 1, 2A, 2B, 3A and 3B. FIGS. 10A through 15A are sectional views corresponding to FIG. 2A, while FIGS. 10B through 15B are sectional views corresponding to FIG. 3A.

Figure 10A:
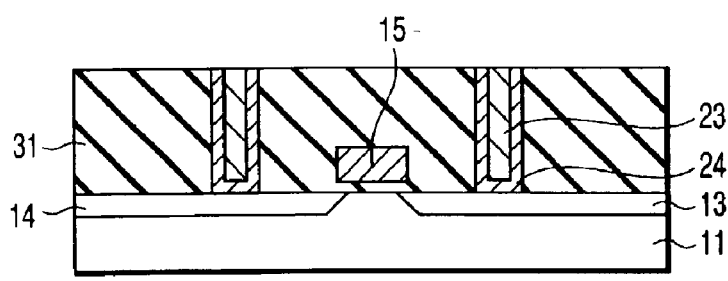
FIGS. 10A, 10B, 11A, 11B, 12A, 12B, 13A, 13B, 14A, 14B, 15A and 15B are sectional views, in the order of steps of manufacture, of the magnetic memory device of FIG. 1.
Figure 10B:
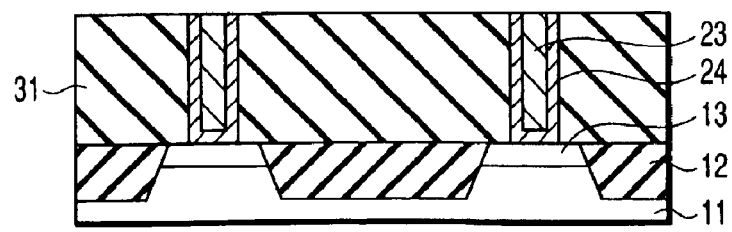

FIGS. 10A and 10B are schematic sectional views as viewed from the same direction as FIGS. 2A and 3A, respectively. As shown in FIGS. 10A and 10B, a device isolation insulating film 12 having STI (Shallow Trench Isolation) structure is selectively formed on the surface of a semiconductor substrate 11. Next, a gate insulating film and a gate electrode 15 are formed over the semiconductor substrate 11. Next, using the gate electrode 15 as a mask an ion implantation process is carried out to form source and drain regions 13 and 14. An interlayer insulating film 31 is formed over the entire surface of the semiconductor substrate 11 by means of CVD (Chemical Vapor Deposition) by way of example. Next, contact holes are formed in the interlayer insulating film 31 so as to pass through it by means of lithographic and RIE (Reactive Ion Etching) techniques by way of example. Next, the contact holes are filled with conductive materials and then planarization is performed by means of CMP (Chemical Mechanical Polishing), whereby the barrier metal 24 and the plug 23 are formed.

Figure 11A:
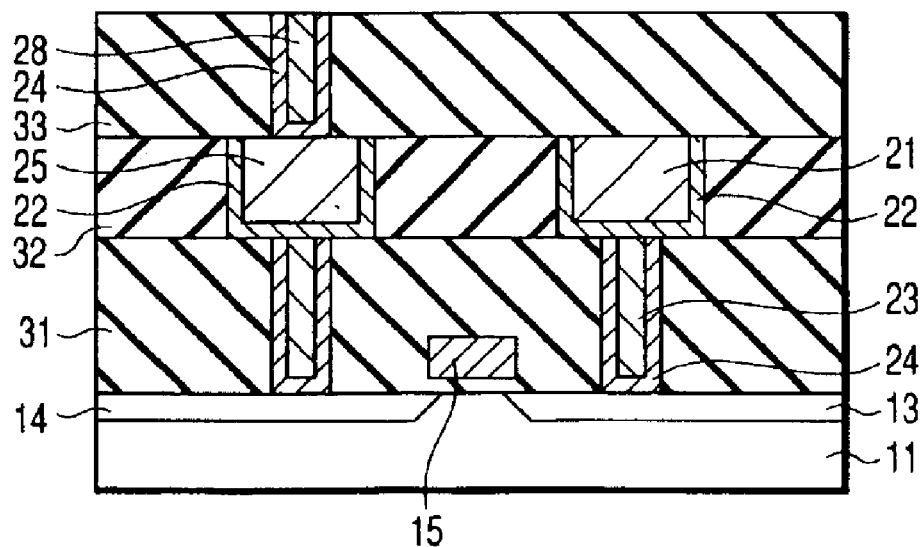
Figure 11B:
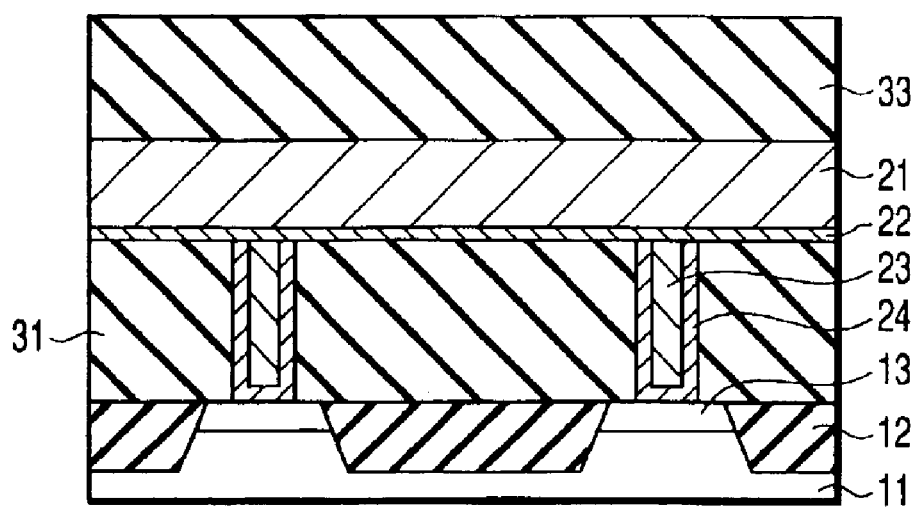

FIGS. 11A and 11B are schematic sectional views as viewed from the same direction as FIGS. 2A and 3A, respectively. As shown in FIGS. 11A and 11B, an interlayer insulating film 32 is formed on the interlayer insulating film 31. Next, trenches for the wiring layers 21 and 25 are formed in the interlayer insulating film 32 and then filled with conductive materials. The resultant structure is next subjected to planarization. As a result, the barrier metal 22 and the wiring layers 21 and 25 are formed.

Next, an interlayer insulating film 33 is formed on the interlayer insulating film 32. Next, a contact hole is formed in the interlayer insulating film 33 and then filled with conductive materials. The resultant structure is next subjected to planarization. As a result, the barrier metal 24 and the plug 28 are formed.

Figure 12A:
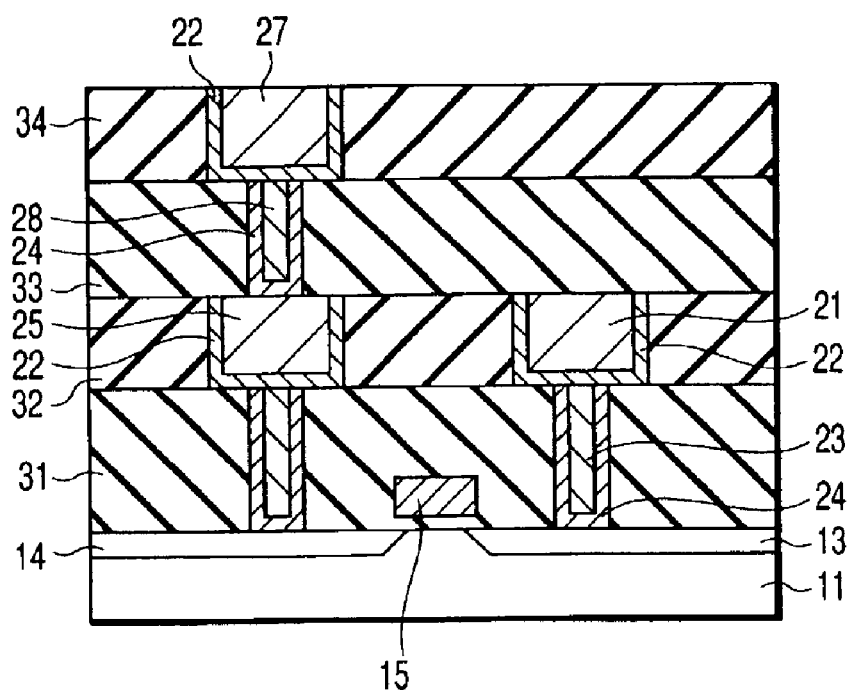
Figure 12B:
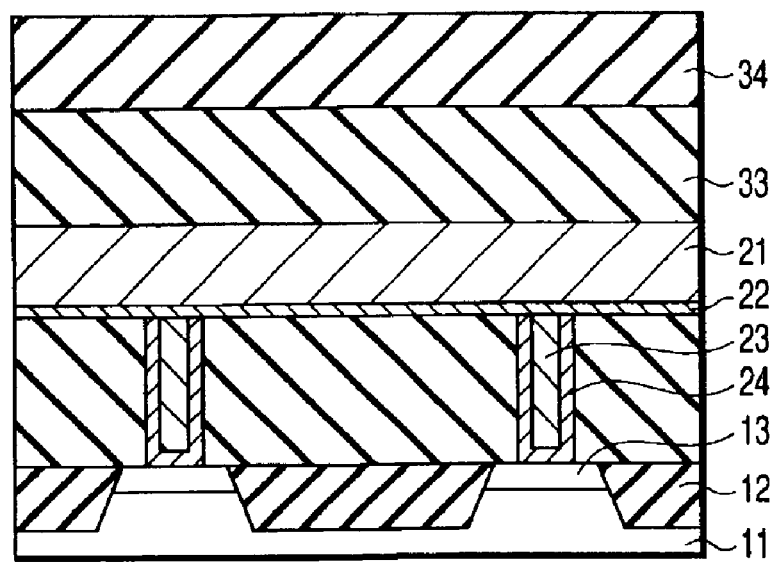

FIGS. 12A and 12B are schematic sectional views as viewed from the same direction as FIGS. 2A and 3A, respectively. As shown in FIGS. 12A and 12B, an interlayer insulating film 34 is formed on the interlayer insulating film 33. Next, a trench for the wiring layer 27 is formed in the interlayer insulating film 34 and then filled with conductive materials. The resultant structure is next subjected to planarization. As a result, the barrier metal 22 and the wiring layer 27 are formed.

Figure 13A:
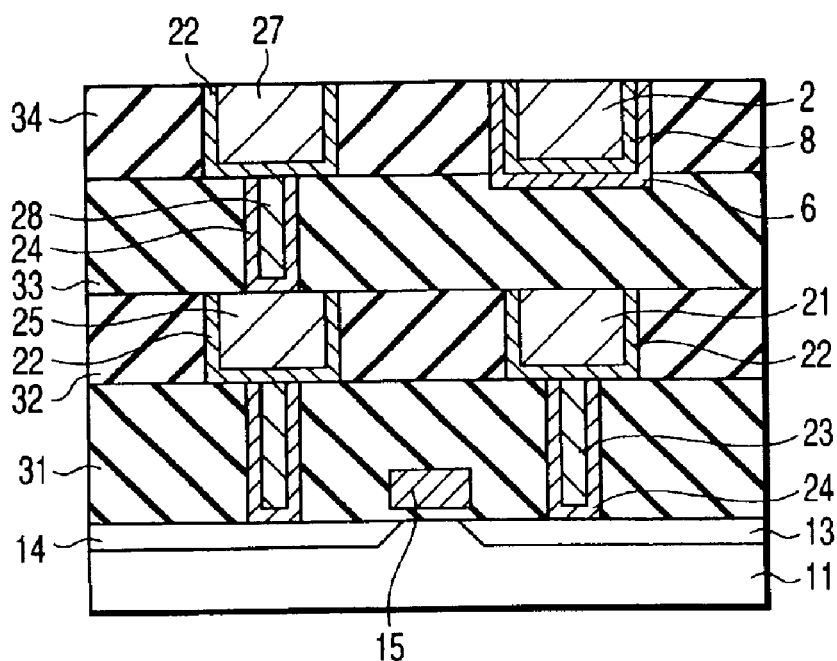
Figure 13B:
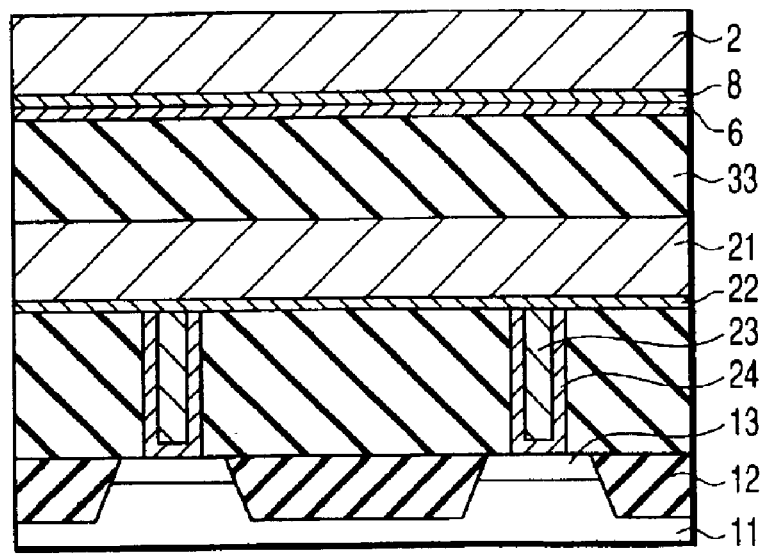

FIGS. 13A and 13B are schematic sectional views as viewed from the same direction as FIGS. 2A and 3A, respectively. As shown in FIGS. 13A and 13B, a trench for the first write wiring 2 is formed in the interlayer insulating film 34. Next, a film of a material for the magnetic circuit 6, a film of a material for the barrier metal 8 and a film of a material for the first write wiring 2 are deposited in sequence onto the inner surface of that trench. The resultant structure is next subjected to planarization. As a result, the magnetic circuit 6, the barrier metal 8 and the first wiring layer 2 are formed.

Figure 14A:
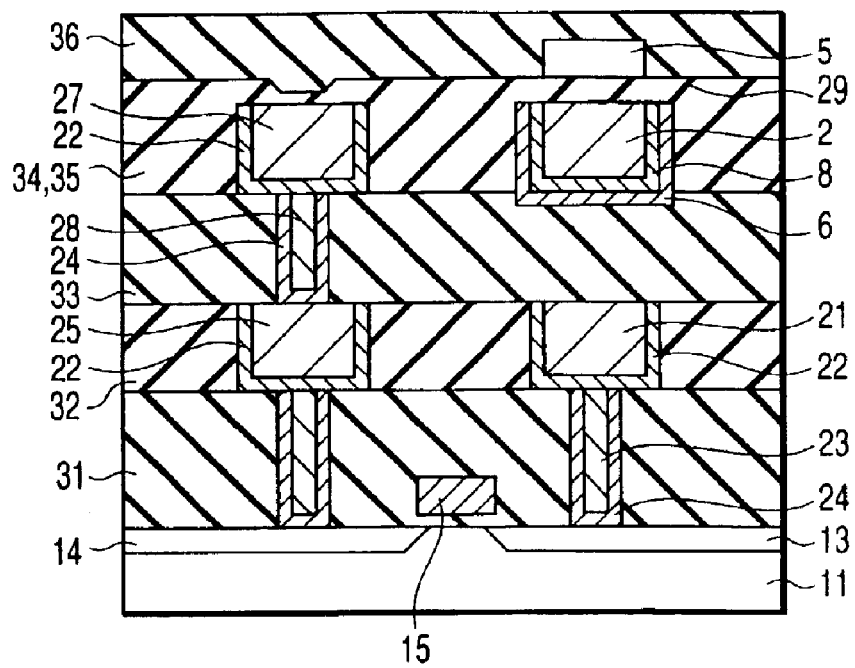
Figure 14B:
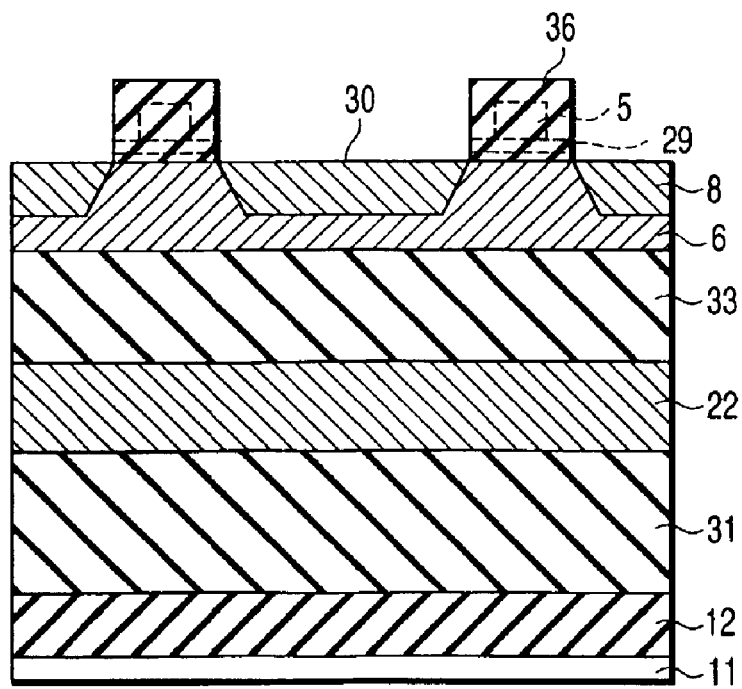

FIGS. 14A and 14B are schematic sectional views as viewed from the same direction as FIGS. 2A and 3B, respectively. As shown in FIGS. 14A and 14B, an interlayer insulating film 35 is formed to cover the wiring layer 27 and the write wiring 2. Next, a contact is formed in the interlayer insulating film 35 and then the connecting wiring layer 29 is formed on the interlayer insulating film 35 so that it is connected with that contact. The memory cell 5 is next formed on the connecting wiring layer 29.

Next, a mask layer 36 is formed to cover the memory cells. The mask layer 36 is formed, as shown in FIG. 14B, along the direction of the first write wiring 2 with substantially the same width as the connecting wiring layer 29. Next, using the mask layer 36 as a mask, part of the upper portion of the magnetic circuit 6 is removed by means of wet etching by way of example. As a result, the magnetic circuit 6 is formed with the notch 30.

Figure 15A:
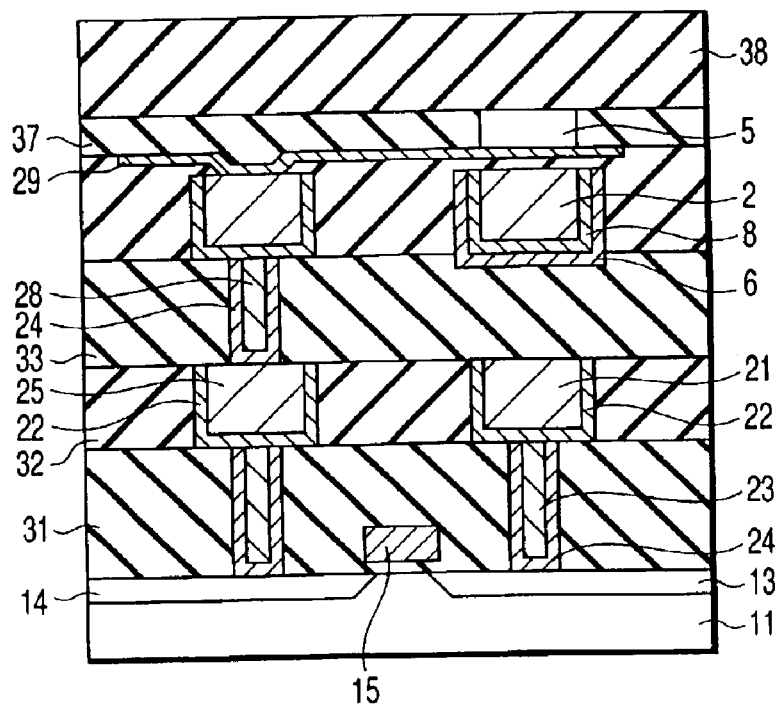
Figure 15B:
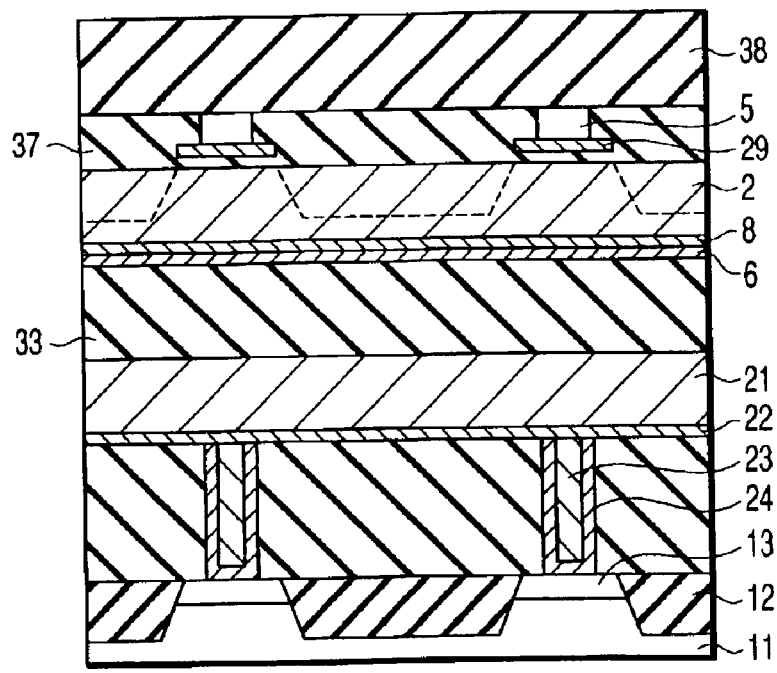

FIGS. 15A and 15B are schematic sectional views as viewed from the same direction as FIGS. 2A and 3B, respectively. As shown in FIGS. 15A and 15B, the mask layer 36 is removed and then an interlayer insulating film 37 is formed between the memory cells. An interlayer insulating film 38 is next formed on the interlayer insulating film 37.

Next, as shown in FIGS. 2A, 2B, 3A and 3B, trenches for the second write wiring 3 are formed on the memory cells 5 in the interlayer insulating film 38 and then filled with conductive materials. The resultant structure is then subjected to planarization. As a result, the second write wiring 3 and the barrier metal 9 are formed. Next, the interlayer insulating film 38 is removed and the magnetic circuit 7 is formed around the barrier metal 9 using known techniques. Next, an insulating film is formed to fill the gap between the second write wiring 3.

According to the first embodiment of the present invention, the magnetic circuit 8 formed around the first write wiring 2 has the notches 30 each of which is formed by removing its upper portion between the second write wiring 3 or memory cells 5. Such a structure allows a magnetic field generated by each of the first write wiring 2 to be applied to a selected memory cell with certainty even in the presence of variations in the size of the memory cells 5 or misalignment of the memory cells with the magnetic circuit 8 (displacement of the memory cells relative to the magnetic circuit). Thus, the magnetic circuit can reduce the write current value and prevent it from varying from cell to cell.

At present, the ratio of the long side to the short side of the memory cell is set to, say, about 1.5. In forming such memory cells, the dimensional control by lithographic technology is generally easy in the direction of short side and difficult in the direction of long side. For this reason, memory cells are subject to variations in size and position in the direction of short side (the same as the first direction) in comparison with the direction of long side (the same as the second direction). As a result, the required write current value may vary from cell to cell. In the first embodiment, therefore, only the magnetic circuit 6 associated with the first write wiring 2 is configured to have notched portions.

The first embodiment is also applicable to a magnetic memory device that reads and writes information using one write wiring. A circuit used in this case is as shown in FIG. 44. As shown in FIG. 44, transistors Tr1 and Tr2 are connected in series between wiring layers BL1 and BL2. To the connection node of the transistors Tr1 and Tr2 is connected one end of an MTJ (corresponding to a memory cell 5). The transistors Tr1 and Tr2 have their respective gates connected to a wiring layer WL. In this figure, the path between the connection node N1 which is formed by the wiring layer BL1 and the transistor Tr1 and the connection node N2 which is formed by the wiring layer BL2 and the transistor Tr2 corresponds to either of the first and second wiring layers 2 and 3.

The operation of the magnetic memory device thus configured will be described briefly. In writing information, a voltage is applied between the wiring layers BL1 and BL2 and then a current is applied to the wiring layer WL, turning on the transistors Tr1 and Tr2. As a result, a current W flows between the nodes N1 and N2, thus allowing information to be written into the MTJ element. The polarity of applied voltage between the wiring layers BL1 and BL2 depends on whether data to be written is 0 or 1.

In reading information, a voltage is applied to the wiring layer BL1 or BL2 and then a current is applied to the wiring layer WL, turning on the transistors Tr1 and Tr2. As a result, a current R flows in the wiring layer BL1 or BL2 and the transistor Tr1 or Tr2. Information is read by detecting the potential difference across the MTJ element.

Such a magnetic memory device is also applicable to other embodiments to be described later.

Second Embodiment

The second embodiment is a modification of the first embodiment. In the second embodiment, the magnetic circuit 6 of the first write wiring 2 is divided into parts and provided only in positions corresponding to the memory cells 5.

Figure 16:
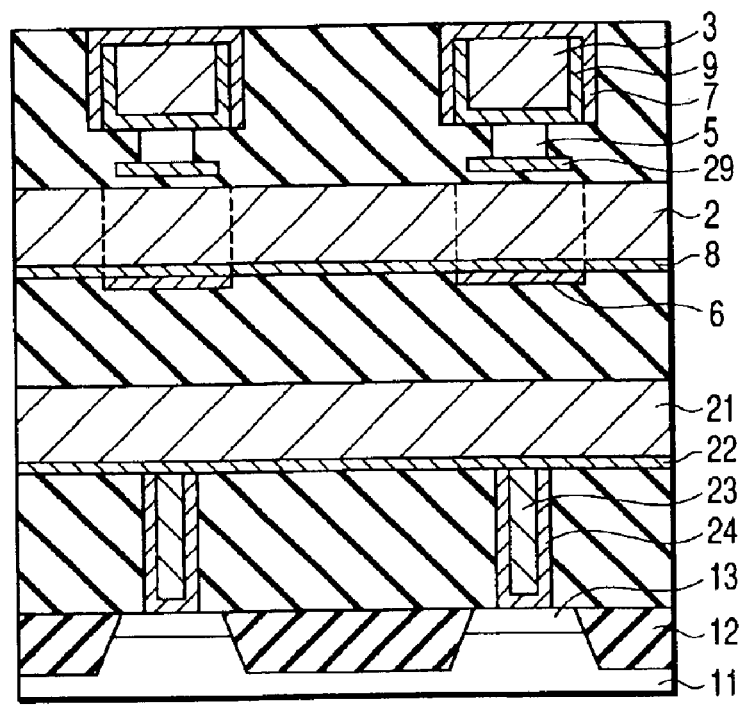
FIG. 16 is a schematic sectional view of a magnetic memory device according to a second embodiment of the present invention.

FIG. 16 is a schematic sectional view of a magnetic memory device according to the second embodiment of the present invention as viewed from the same direction as FIG. 3A. The plan view and the sectional view corresponding to FIG. 2A remain unchanged from those in the first embodiment.

As shown in FIG. 16, the magnetic circuit 6 is provided, on the sides and downsides of the barrier metal 8, in the position corresponding to the overlying second wiring layer 3 or memory cell 5. Other parts remain unchanged from the first embodiment.

Figure 17:
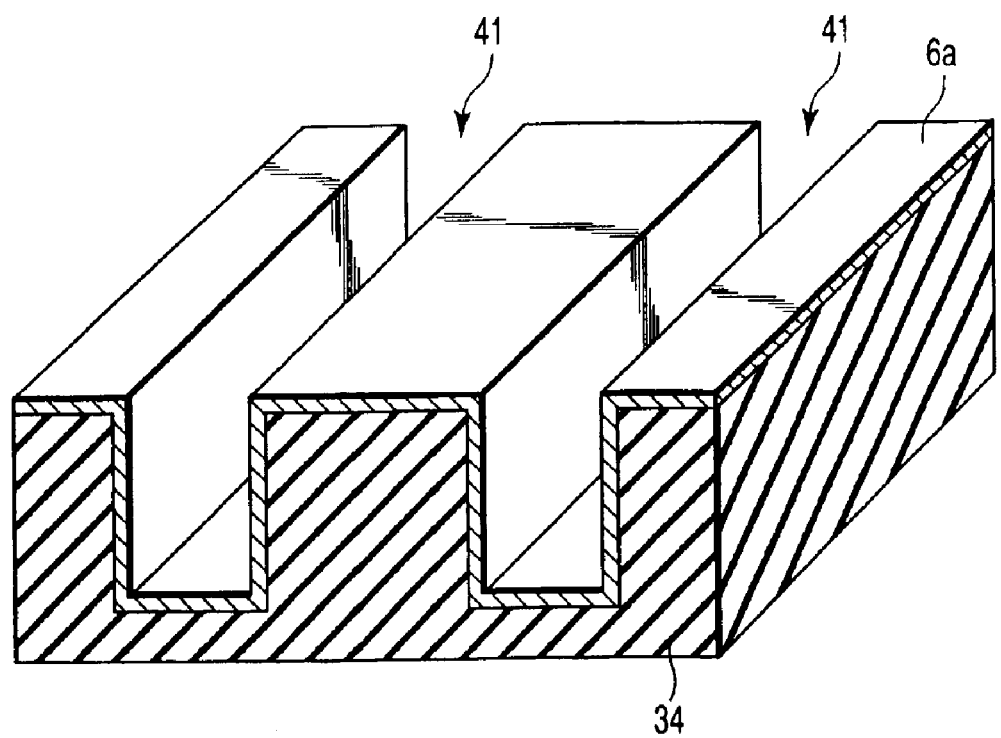
FIGS. 17, 18 and 19 are perspective views, in the order of steps of manufacture, of the magnetic memory device of FIG. 16.

Next, a method of manufacture of the magnetic memory device shown in FIG. 16 will be described with reference to FIGS. 17, 18 and 19. In these figures, only portions corresponding to the interlayer insulating film 34, the first write wiring 2 and the magnetic circuit 6 are illustrated.

The second embodiment remains unchanged from the first embodiment up to the step of FIGS. 12A and 12B. After that, as shown in FIG. 17, trenches 41 for the write wiring 2 are formed in the interlayer insulating film 34 by means of lithographic and RIE techniques. Next, a film 6a of a material of the magnetic circuit 6 is deposited onto the inner wall of the trenches 41 and the interlayer insulating film 34.

Figure 18:
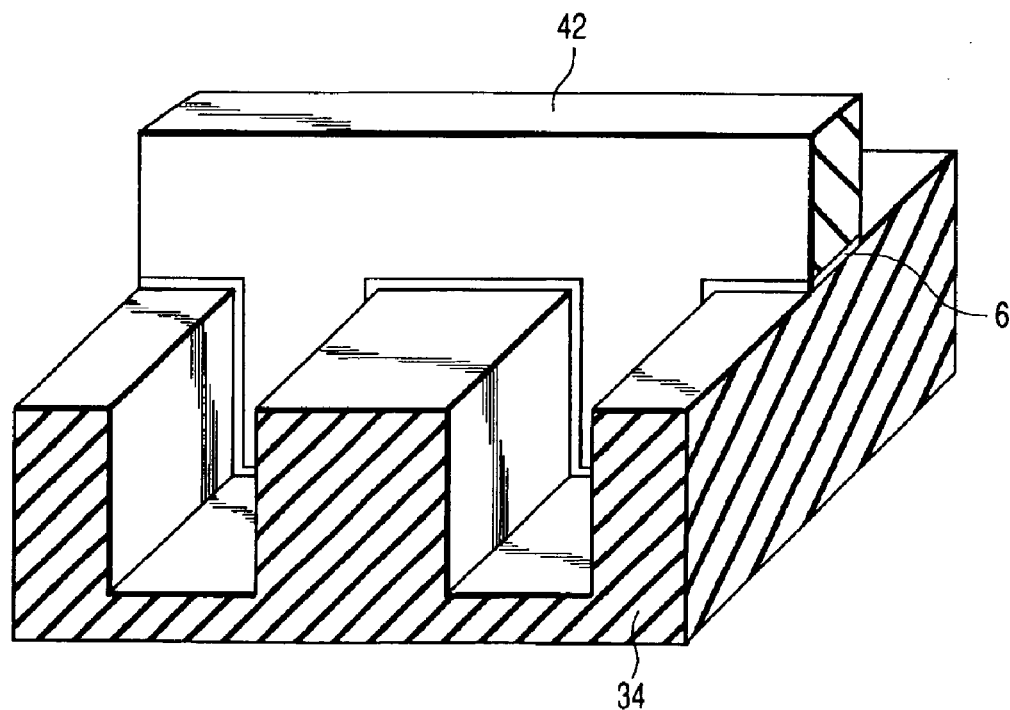

Next, as shown in FIG. 18, a mask layer 42 is formed on the magnetic circuit 6 so as to cover portions where the magnetic circuit is to be formed, using CVD, lithographic and RIE techniques. Next, using the mask layer 42 as a mask, exposed portions of the film 6a are removed, so that individually divided magnetic circuits 6 are formed in the direction of length of the trenches 41.

Figure 19:
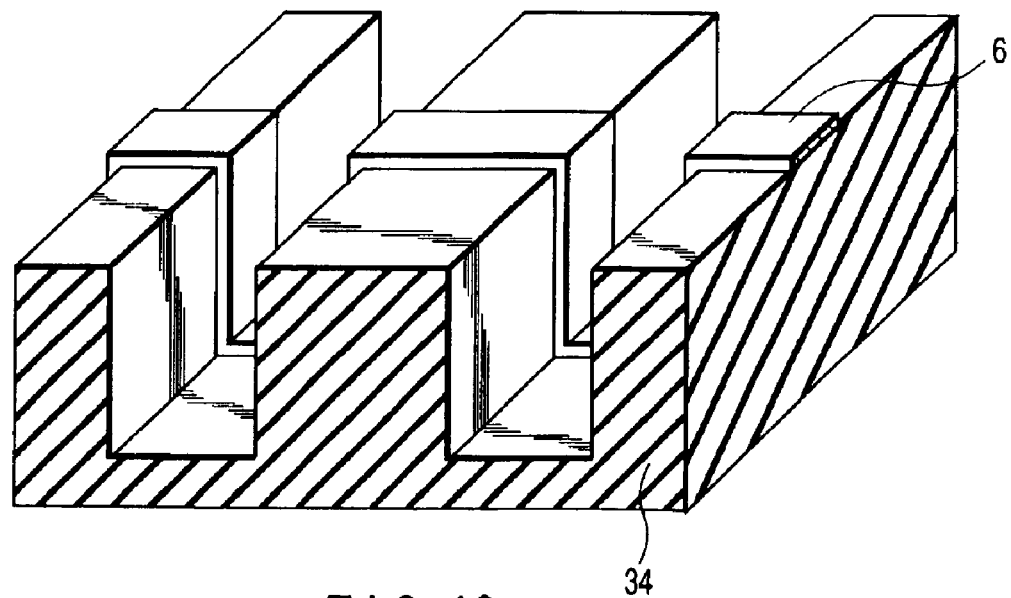

Next, the mask layer 42 is removed as shown in FIG. 19. Next, the trenches 53 are filled with a film of a material of the barrier metal 8 and a film of a material of the write wiring 2 and then excessive films are planarized. Subsequently, the same steps as with the first embodiment are carried out.

According to the second embodiment, each of the magnetic circuits 6 of the first wiring layer 2 is provided separately in position corresponding to a second write wiring 3 or memory cell 5. Such a structure will provide substantially the same advantages as the first embodiment.

In the second embodiment, the process of forming the magnetic circuits 5 of the first write wiring 2 becomes complicated in comparison with the first embodiment. However, a magnetic field generated by the first write wiring 2 can be applied to a selected memory cell through the corresponding magnetic circuit with more certainty than in the first embodiment.

Third Embodiment

In the first embodiment, only the magnetic circuit 6 of the first wiring layer 2 has notched portions 30. In contrast, in the third embodiment, the magnetic circuit 7 of the second write wiring 3 is also configured to have the similar structure.

FIG. 20 is a schematic sectional view of a magnetic memory device according to the third embodiment of the present invention as viewed from the same direction as FIG. 2A. The plan view and the sectional view corresponding to FIG. 3A remain unchanged from those in the first embodiment.

As shown in FIG. 20, the magnetic circuit 7 is provided around the barrier metal 9 and the second write wiring 3 so that it extends along the sides and top of the second write wiring 3. The magnetic circuit 7 has notches 30 in its portions between the first write wiring 2 or memory cells 5 and on the sides of the barrier metal 9 of the second write wiring 3. The notches 30 have substantially the same shape as those in the first embodiment and are formed upward from the lower end of the magnetic circuit 7. The other portions remain unchanged from those in the first embodiment.

Next, a method of manufacture of the magnetic memory device shown in FIG. 20 will be described with reference to FIGS. 21, 22, 23 and 24. In these figures, only portions corresponding to the interlayer insulating film 38, the second write wiring 3, the barrier metal 9 and the magnetic circuit 7 are illustrated.

The third embodiment remains unchanged from the first embodiment up to the step of FIGS. 15A and 15B. After that, as shown in FIG. 21, trenches for the write wiring 3 are formed in the interlayer insulating film 38 by means of lithographic and RIE techniques. These trenches are connected with memory cells 5 not shown. Next, a film of a material of the barrier metal 9 and a film of a material of the write wiring 3 are deposited onto the inner wall of the trenches and the top of the interlayer insulating film 38. The excessive films are then subjected to planarization, so that the barrier metal 9 and the wiring layer 3 are formed in the trenches.

Figure 22:
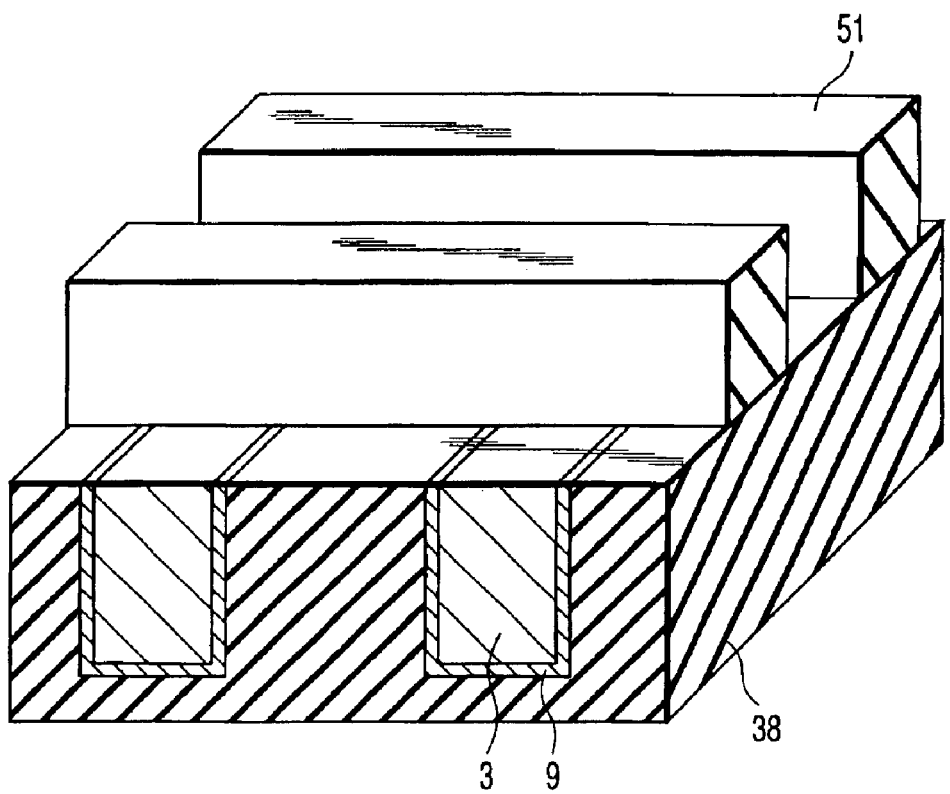

Next, as shown in FIG. 22, a mask layer 51 is formed on the write wiring 3 and the interlayer insulating film 38 so as to intersect the wiring layers 3. The mask layer is located above portions corresponding to where notches 30 are to be formed.

Figure 23:
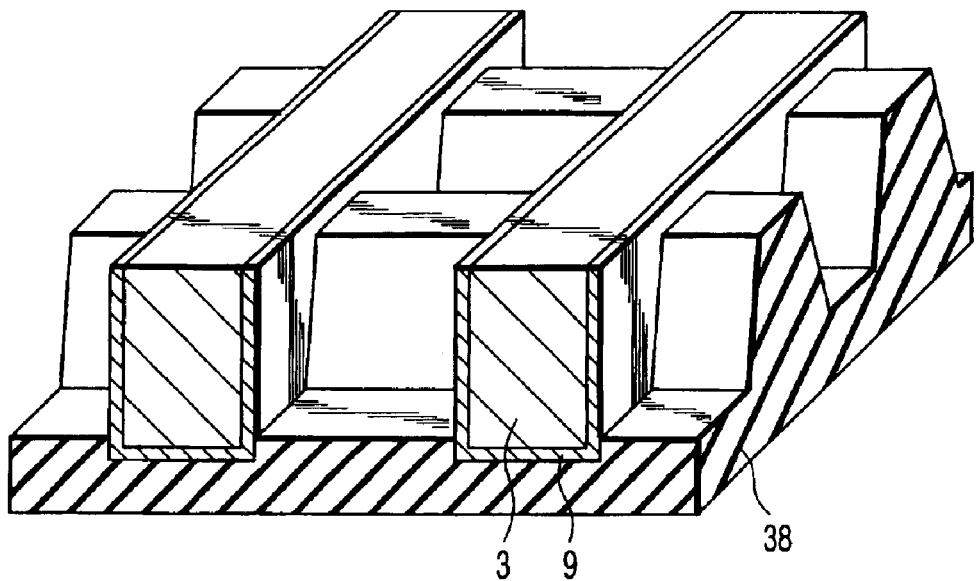

Next, as shown in FIG. 23, using the mask layer 51 as a mask, portions of the interlayer insulating film 38 are etched by means of RIE. At this point, the mask layer is gradually narrowed by performing the etching process in an oxygen atmosphere. As a result, the remaining interlayer insulating film 38 becomes trapezoidal in profile as shown. However, a simple etching process may be performed instead. In this case, the sides of the remaining interlayer insulating film will become substantially vertical and the notches of the magnetic circuit 7 will be formed into a corresponding shape.

Figure 24:
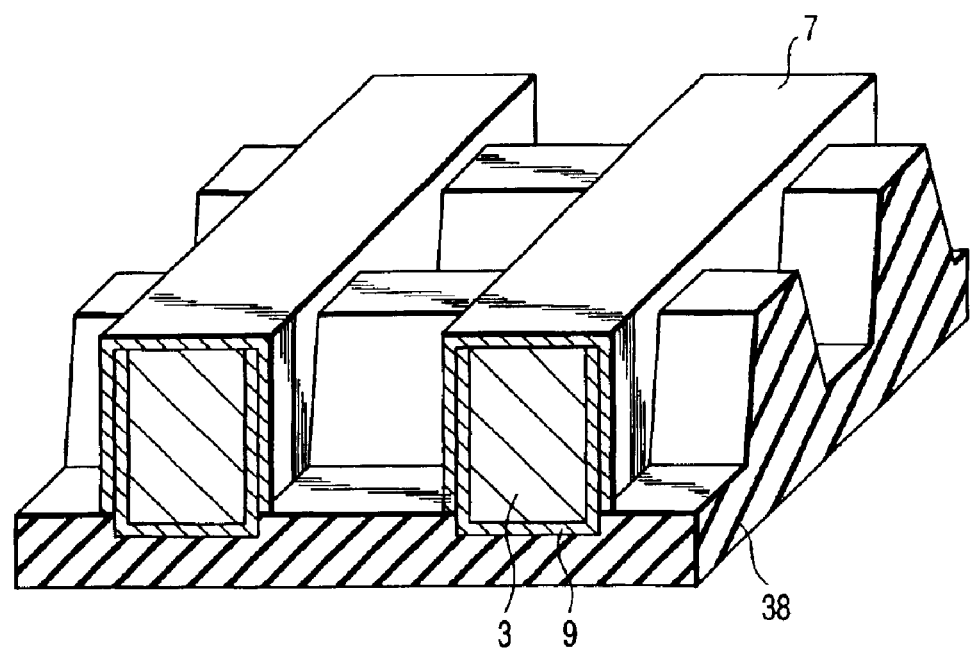

Next, as shown in FIG. 24, a film of a material of the magnetic circuit 7 is deposited by means of electroplating method with the semiconductor substrate not shown maintained at a constant potential. As a result, the film for the magnetic circuit 7 selectively grows in portions where the barrier metal 9 is in contact with the plating solution. Thus, the magnetic circuit 7 is formed on the top of the write wiring 4 and the sides of the barrier metal 9 which are not covered with the interlayer insulating film 38. The subsequent steps are the same as those in the first embodiment.

The third embodiment will provide the same advantages as the first embodiment. In the third embodiment, the magnetic circuit 7 of the second write wiring 3 as well as the magnetic circuit 6 of the first write wiring 2 is structured to have notches. Thus, the same advantages as those of the first embodiment are also obtained for the second write wiring 3.

Figure 25:
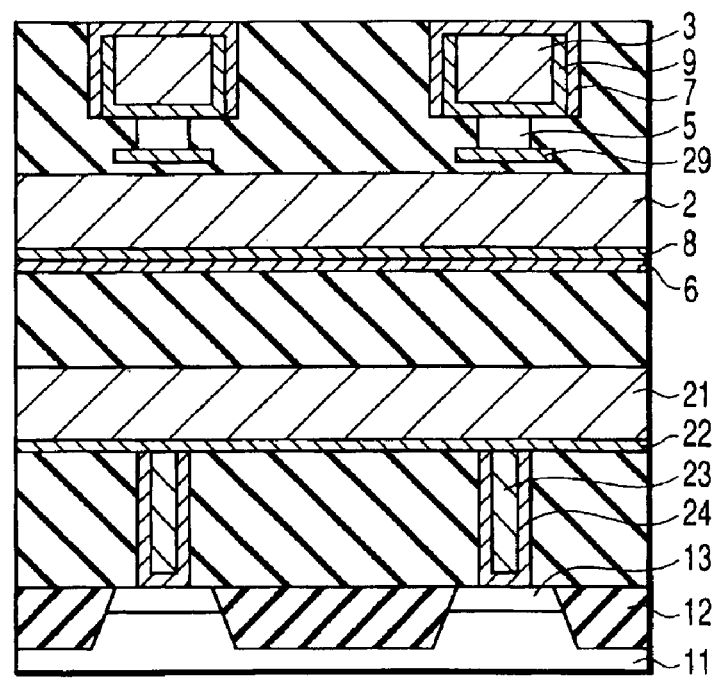
FIG. 25 is a schematic sectional view of a magnetic memory device according to a modification of the third embodiment of the present invention.

It is also possible to form the notches 30 only in the magnetic circuit 7 of the second write wiring 3 along the direction of long side of the memory cells 5. In this case, the sectional view corresponding to FIG. 3A will become as depicted in FIG. 25.

Fourth Embodiment

The magnetic memory device of the second embodiment is designed such that only the magnetic circuit 6 of the first write wiring 2 is divided into parts corresponding in position to the memory cells 5. In the fourth embodiment, unlike the second embodiment, the magnetic circuit 7 of the second write wiring 3 also has the same structure.

Figure 26:
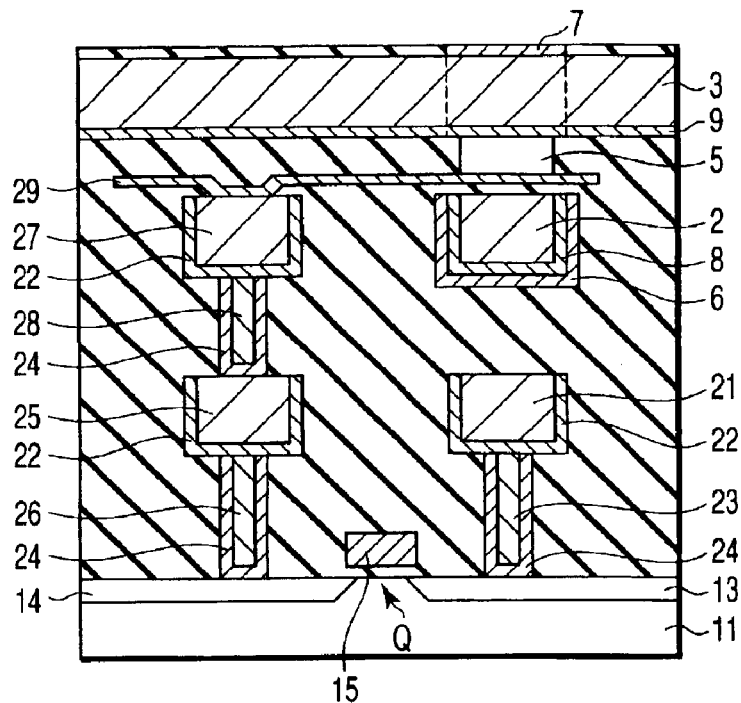
FIG. 26 is a schematic sectional view of a magnetic memory device according to a fourth embodiment of the present invention.

As shown in FIG. 26, the magnetic circuit 7 is provided, on the sides and top of the barrier metal 9, in the position corresponding to the underlying the first wiring layer 2 or the memory cell 5. In other respects, the fourth embodiment remains unchanged from the second embodiment.

The fourth embodiment provides substantially the same advantages as the second embodiment for the second write wiring 3 as well.

It is also possible to divide only the magnetic circuit 7 of the second write wiring 3 along the direction of long side of the memory cells into parts corresponding in position to the memory cells 5. In this case, the sectional view corresponding to FIG. 3A will become as depicted in FIG. 25.

Fifth Embodiment

The first embodiment is directed to a magnetic memory device of the select transistor type. On the other hand, the fifth embodiment is an application of the present invention to a magnetic memory device of the so-called cross-point type.

Figure 27:
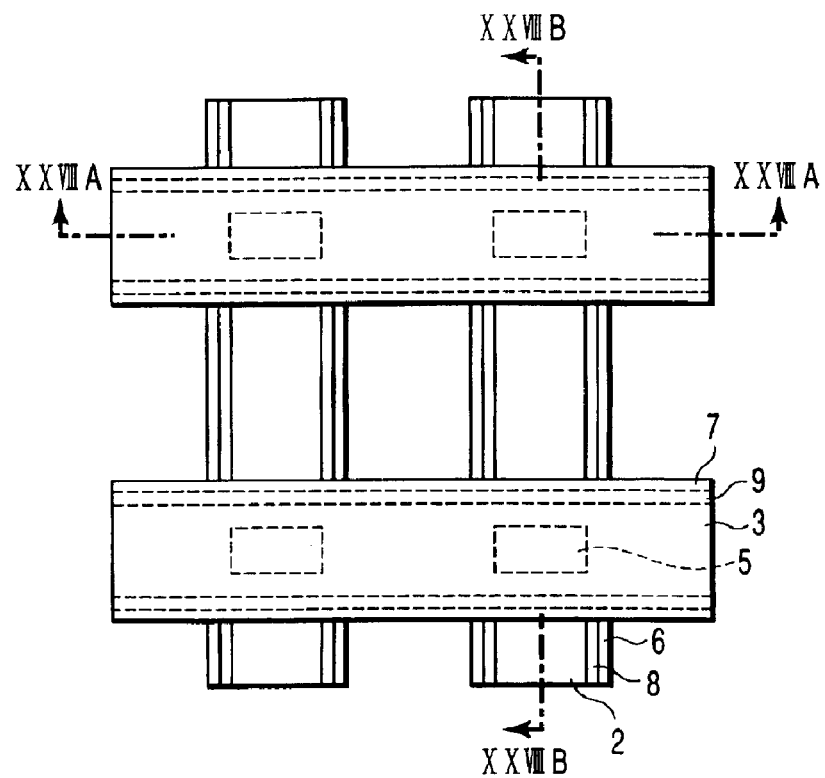
FIG. 27 is a schematic sectional view of a magnetic memory device according to a fifth embodiment of the present invention.

FIG. 27 is a schematic plan view of a magnetic memory device according to the fifth embodiment of the present invention. FIGS. 28A and 28B are schematic sectional views taken along lines XXVIIIA—XXVIIIA and XXVIIIB—XXVIIIB in FIG. 27.

As shown in FIGS. 27, 28A and 28B, the first write wirings 2 are provided in the interlayer insulating film 61 which is provided on the substrate 11. The barrier metal 8 and the magnetic circuit 6 are provided around the first write wiring 2. The magnetic circuit 6 has notches formed in its portions between each second wiring layer 3 or memory cell 5.

Connecting layers 62 made of a nonmagnetic material and memory cells 5 are provided on the first write wiring 2.

The second write wiring 3 is provided on the memory cells 5. The barrier metal 9 and the magnetic circuit 7 are provided around the second write wiring 2. The magnetic circuit 7 has notches 30 between the first write wirings 2 or the memory cells 5, as similar to the first embodiment.

In the magnetic memory device of the cross-point type, the first and second write wirings 2 and 3 are electrically coupled with each other. The second write wiring 3 has a function of reading information from memory cells as well as a function of applying a magnetic field to the memory cells.

In the magnetic memory device of the cross-point type, attention must be paid to a potential difference between the write wirings which is produced at write time. That is, in writing information into a memory cell, a high voltage may be produced between the first and second write wirings 2 and 3 due to write current flow. In the magnetic memory device of the cross-point type, since the first and second write wirings 2 and 3 are electrically coupled with each other as mentioned above, the tunnel barrier layer may undergo dielectric breakdown due to the high voltage. To prevent dielectric breakdown, a rectifying element can be connected in series with each memory cell. Other circuit accommodations may be used to prevent the application of high voltage to the memory cells.

The fifth embodiment will provide substantially the same advantages as the first and third embodiments.

Sixth Embodiment

Figure 29A:
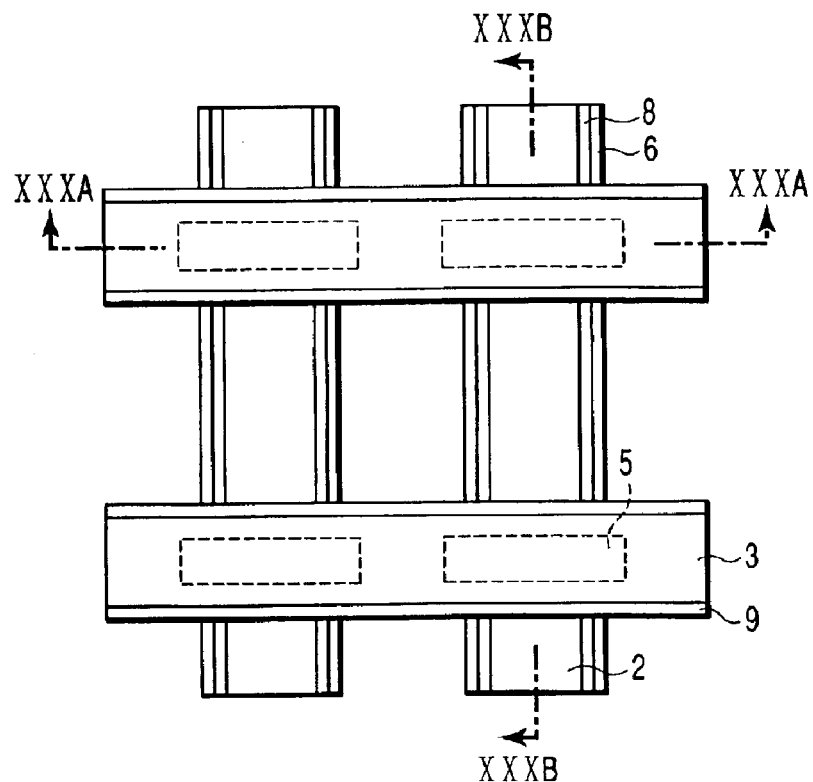
FIGS. 29A and 29B are schematic plan views of a magnetic memory device according to a sixth embodiment of the present invention.
Figure 29B:
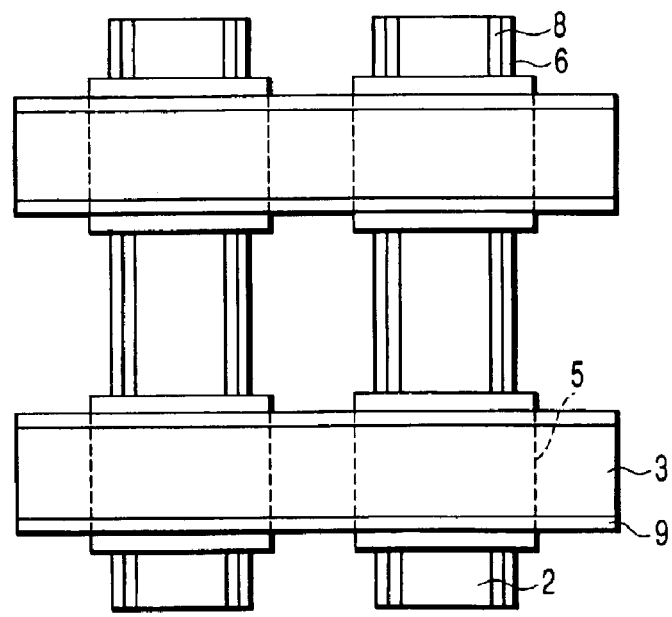
Figure 30A:
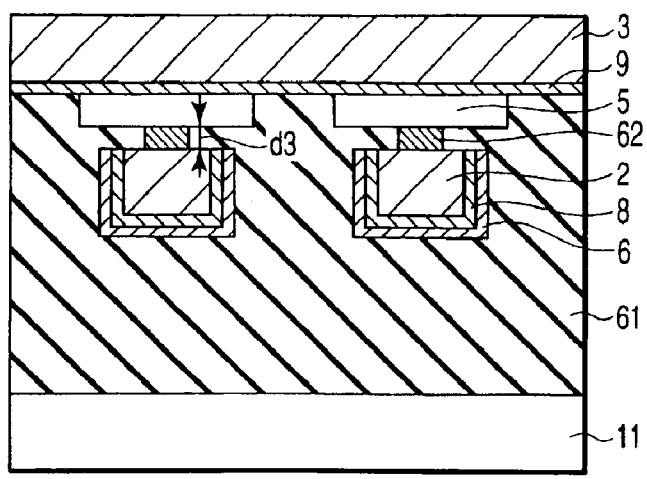
FIGS. 30A and 30B are schematic sectional views taken along lines XXXA—XXXA and XXXB—XXXB, respectively, of FIG. 29A.
Figure 30B:
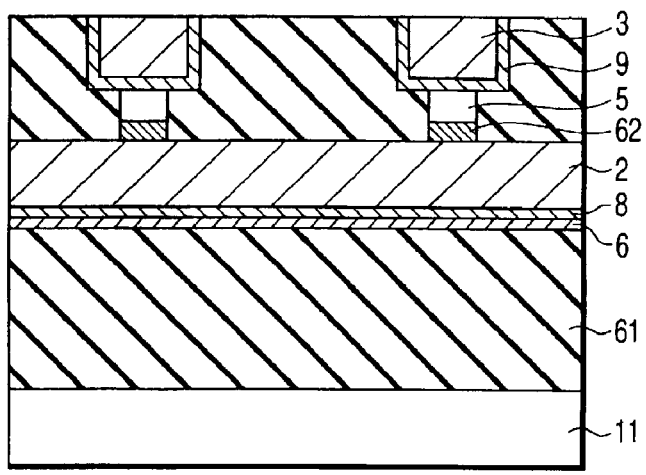

FIG. 29A is a schematic plan view of a magnetic memory device according to a sixth embodiment of the present invention. FIG. 29B shows a modification of the sixth embodiment. FIGS. 30A and 30B are schematic sectional views taken along lines XXXA—XXXA and XXXB—XXXB in FIG. 29A.

As shown in FIGS. 29A, 30A and 30B, the magnetic circuit 6 is provided on the barrier metal 8 of the first write wiring 2 to extend along the sides and underside of the write wiring 2. The memory cell 5 is provided on the first write wiring 2 with a connecting layer 62 interposed therebetween. The memory cell 5 is larger in width than the magnetic circuit 6. The size of the memory cell 5 is determined as follows:

For example, at a 0.1 μm rule, the width of the magnetic circuits 6 and 7 is approximately equal to that of the first and second write wirings and is about 0.1 μm. The tolerance of overlay accuracy for the width in this case is expected to be 20%, i.e., ±0.020 μm. In view of this value and a variation of ±10% in the size of memory cells, the width of the memory cells 5 is preferably set to about 160% of the width of the magnetic circuit 6. More specifically, the size of the memory cells can be set to 120 to 280% of the width of the magnetic circuit 6 and preferably 150 to 180%. More preferably, the size of the memory cells is 160% of the width of the magnetic circuit 6 (i.e., about 0.16 μm in this embodiment). In other respects, the sixth embodiment remains unchanged from the fifth embodiment.

The above structure allows the distance between the memory cell 5 and the magnetic circuit 5 to depend on the distance in the vertical direction in FIG. 30A, and the distance is d3. The distance d3 is defined by the thickness of the connecting layer 62. In manufacturing semiconductor devices, the control accuracy of distance in the vertical direction is determined by the thickness of deposited layers and the etching depth rather than the control accuracy in lithographic steps and hence is higher than the control accuracy in the horizontal direction. For this reason, the distance between the memory cell 5 and the magnetic circuit 6 can be set to a desired value with relatively high accuracy. Thus, processing variations can be suppressed easily in comparison with the prior arts without being affected by some dimensional variations and misalignment.

In the sixth embodiment, the memory cell 5 is larger in width than the magnetic circuit 6 of the first write wiring 2.

For this reason, the distance between the memory cell 5 and the magnetic circuit 6 is defined by the thickness of the connecting layer 62 and hence set at a substantially constant value. Thus, it becomes possible to prevent the write current value from varying from cell to cell due to variations in the distance between the memory cell 5 and the magnetic circuit 6 while the write current value can be kept low.

It is also possible to, as shown in FIG. 29B, set the width of the memory cell 5 (the length along the first direction in which the first write wiring 2) extends larger than the width of the second write wiring 3 (the width of the magnetic circuit 7).

Seventh Embodiment

In the sixth embodiment, the entire memory cell 5 is larger in width than the magnetic circuit 6. In contrast, in the seventh embodiment, only part of the layers forming the memory cell 5 is larger in width than the memory cell.

Figure 31:
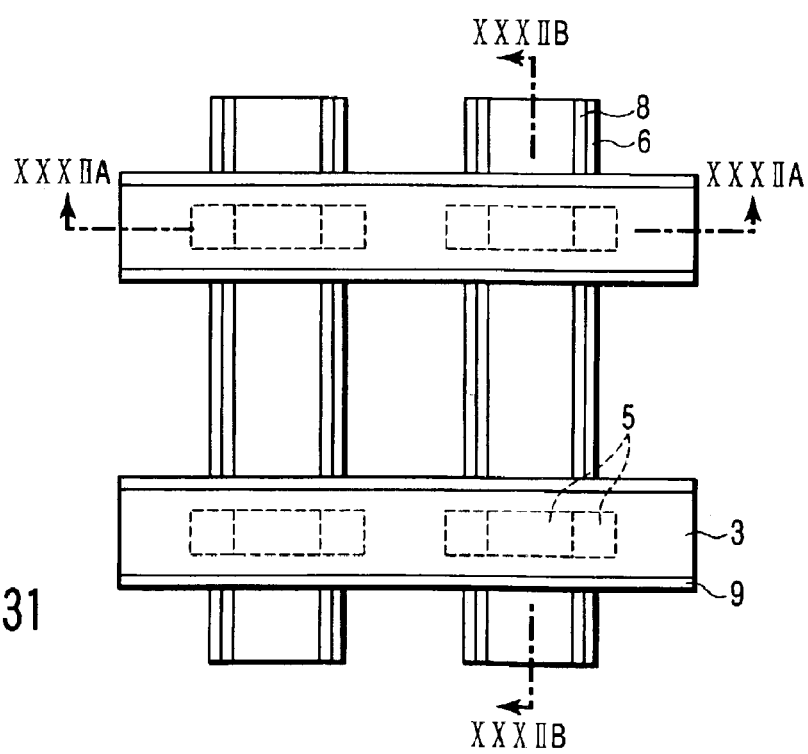
FIG. 31 is a schematic plan view of a magnetic memory device according to a seventh embodiment of the present invention.
Figure 32A:
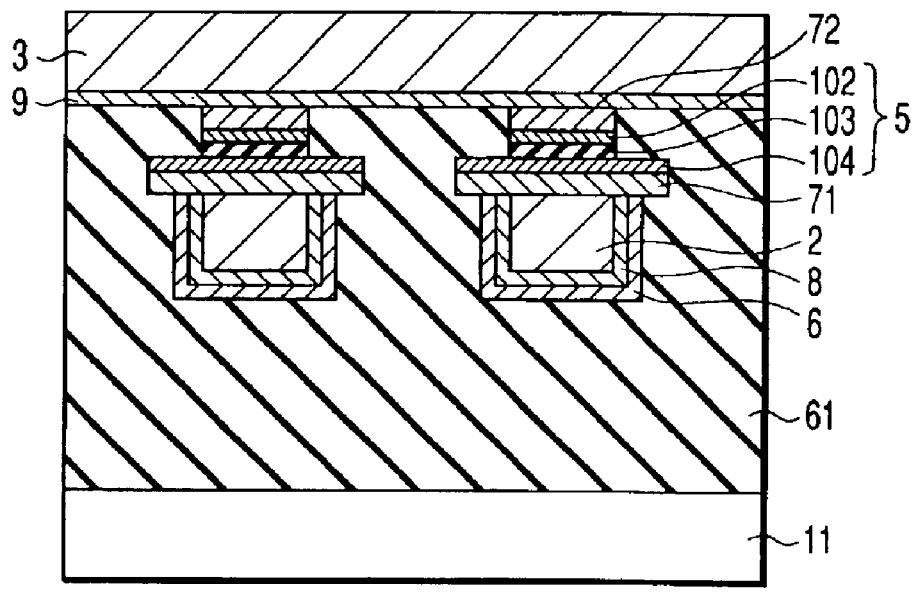
FIGS. 32A and 32B are schematic sectional views taken along lines XXXIIA—XXXIIA and XXXIIB—XXXIIB, respectively, of FIG. 31.
Figure 32B:
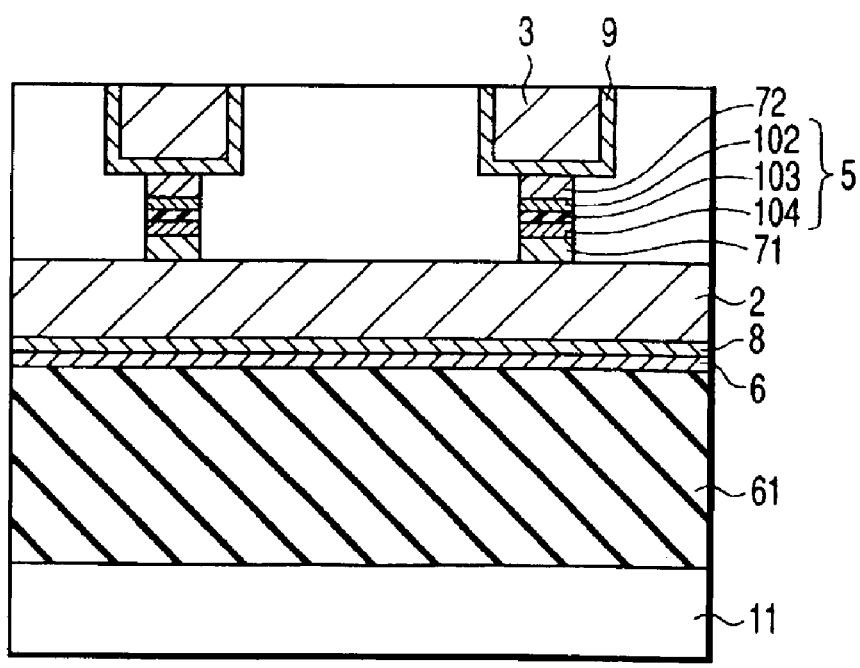

FIG. 31 is a schematic plan view of a magnetic memory device according to the seventh embodiment of the present invention. FIGS. 32A and 32B are schematic sectional views taken along lines XXXIIA—XXXIIA and XXXIIB—XXXIIB in FIG. 31.

As shown in FIGS. 31, 32A and 32B, a connecting layer 71 of nonmagnetic metal and a recording layer 104 of the memory cell 5 are formed in sequence on the first write wiring 2. Each of the connecting layer 71 and the recording layer 104 has a larger width than the magnetic circuit 6. The connecting layer 71 and the recording layer 104 have the same width as the memory cell 5 of, for example, the fifth embodiment.

On the recording layer 104 are sequentially formed the tunnel barrier layer 103, the pinned layer 102 and a connecting layer 72 the width of which is smaller than that of the connecting layer 71 and the recording layer 104 and is set substantially equal to that of the first write wiring 2. In other respects, the seventh embodiment remains unchanged from the sixth embodiment.

Next, a method of manufacture of the magnetic memory device shown in FIGS. 31, 32A and 32B will be described with reference to FIGS. 33 and 34, which are sectional views corresponding to FIG. 32A.

Figure 33:
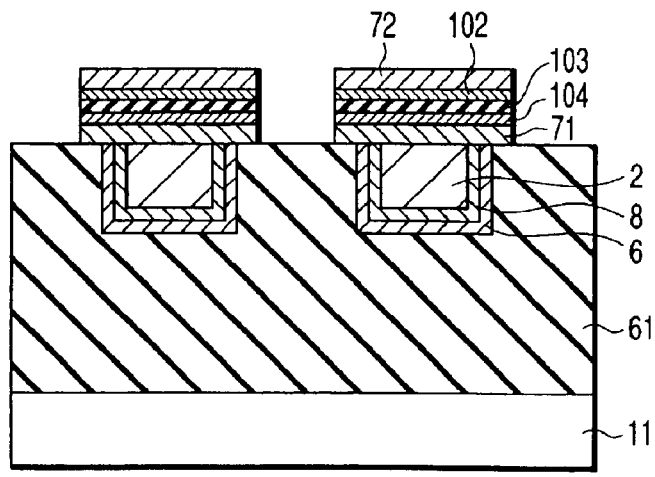
FIGS. 33 and 34 are sectional views, in the order of steps of manufacture, of the magnetic memory device of FIG. 31.

As shown FIG. 33, the magnetic circuit 6, the barrier metal 8 and the first write wiring 2 are formed in the interlayer insulating film 61. Next, material film of the connecting layer 71, the recording layer 104, the tunnel barrier layer 103, the pinned layer 102 and the connecting layer 72 are sequentially deposited over the entire surface of the interlayer insulating film 61. These layers are then patterned to leave portions rectangular in shape. Each of the rectangular portions is long in the direction perpendicular to the first write wiring 2 and, when viewed from above, has each of its opposite ends in the direction of its length positioned outside a corresponding one of the opposite ends of the magnetic circuit 6.

Figure 34:
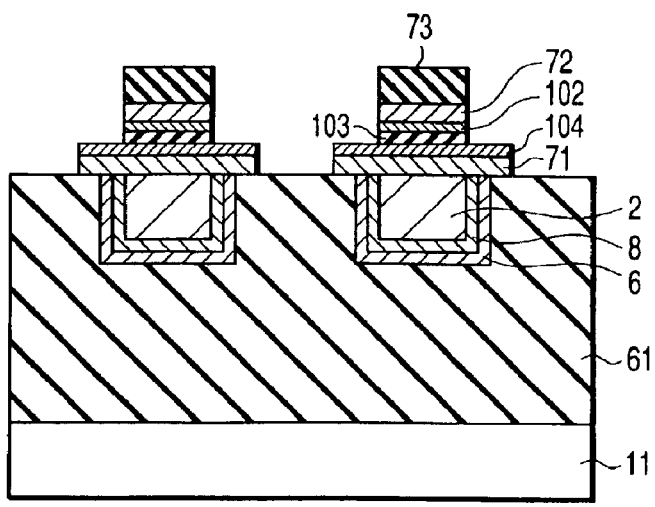

Next, as shown in FIG. 34, the mask layer 73 is formed on the connecting layer 72. The mask layer has a linear form and a width substantially equal to that of the first write wiring 2. Next, using the mask layer 73 as a mask, the connecting layer 72, the pinned layer 102 and the tunnel barrier layer 103 are etched so that they comes to have substantially the same width as the first write wiring 2. At this point, the recording layer 104 and the connecting layer 42 are not etched.

The direction of short side in etching the connecting layer 72, the pinned layer 102 and the tunnel barrier layer 103 corresponds to the direction of the width of the mask layer 73 (the horizontal direction of FIG. 34). For this reason, the controllability of etching in this direction becomes good, allowing the size of the connecting layer 72, the pinned layer 102 and the tunnel barrier layer 103 to be controlled with high accuracy for each memory cell.

After that, the mask layer 73 is removed and then an interlayer insulating film is deposited to bury the memory cell 5 and the connecting layer 71, 73. Next, the barrier metal 9 and the second write wiring 3 are formed in sequence.

Next, the advantages of the seventh embodiment will be described.

As described above, the magnetoresistance effect is used in reading information. In the magnetic memory device structured as described above, the parts of the recoding layer 104 whose size corresponds the pinned layer 102 and the tunnel barrier layer 103 contribute to the magnetoresistance effect.

In the seventh embodiment, only the recording layer 104 of the memory cell 5 has a larger width than the magnetic circuit 6, which provides the same advantages as the sixth embodiment.

In addition, in the seventh embodiment, the width of the tunnel barrier layer 103 and the pinned layer 102 (the horizontal direction of FIG. 34) is defined by the mask layer 73 in the form of a straight line. Thus, it becomes possible to prevent the size of the tunnel barrier layer 103 and the pinned layer 102 from varying from cell to cell, in other words, to prevent the resistance value from varying from cell to cell. This ensures a wide margin for reading.

Eighth Embodiment

Figure 35:
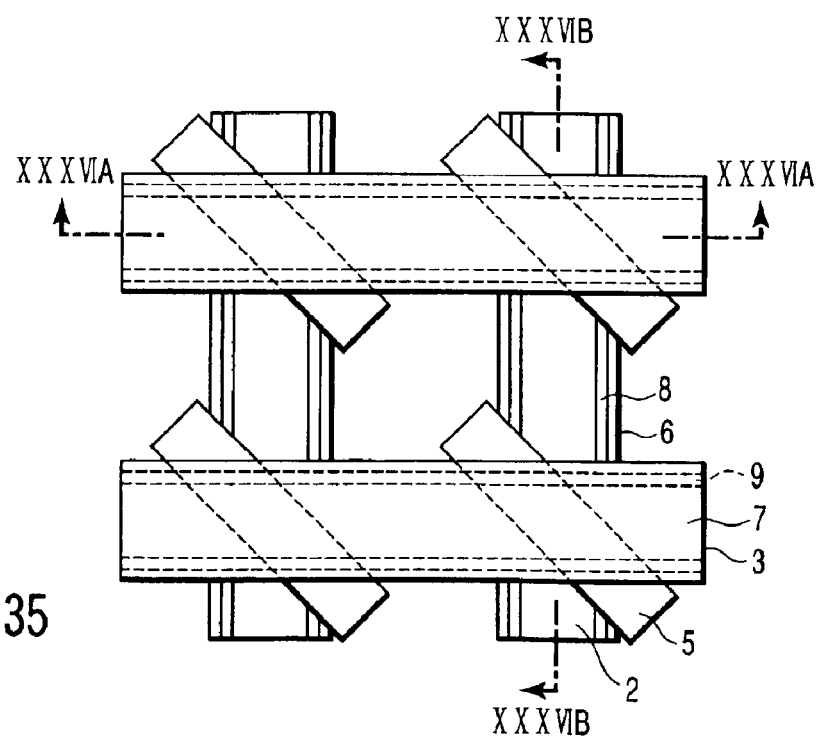
FIG. 35 is a schematic plan view of a magnetic memory device according to an eighth embodiment of the present invention.
Figure 36A:
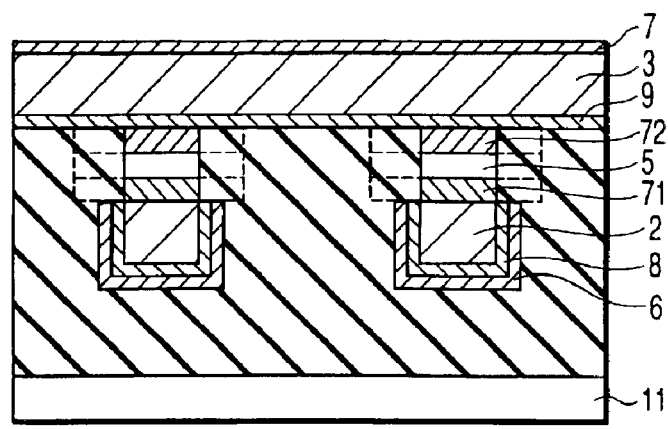
FIGS. 36A and 36B are schematic sectional views taken along lines XXXVIA—XXXVIA and XXXVIB—XXXVIB, respectively, of FIG. 35.
Figure 36B:
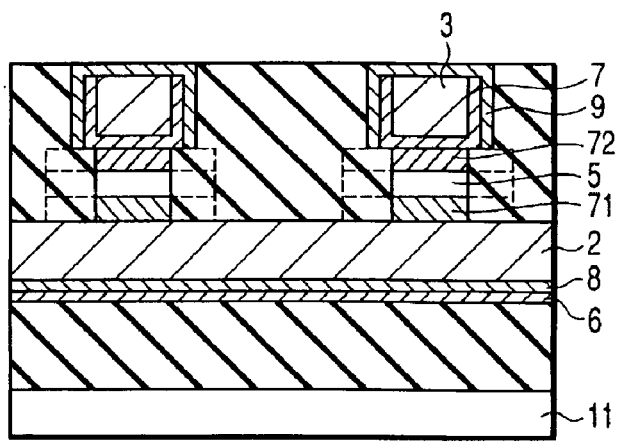

FIG. 35 is a schematic plan view of a magnetic memory device according to an eighth embodiment of the present invention. FIGS. 36A and 36B are schematic sectional views taken along lines XXXVIA—XXXVIA and XXXVIB—XXXVIB in FIG. 35.

As shown in FIGS. 35, 36A and 36B, between the first and second write wiring 2 and 3 are provided the connecting layer 71, the memory cell 5 and the connecting layer 72 which are stacked in this order. The connecting layer 71, the memory cell 5 and the connecting layer 72 are provided, as shown in FIG. 35, in a direction different from the direction in which each of the first and second write wiring 2 and 3 extends. This direction can be made coincident with the direction of a composite magnetic field generated by the wiring layers 2 and 3. The connecting layer 71, the memory cell 5 and the connecting layer 72 can be oriented at an angle of, say, 45° with respect to each of the write wiring 2 and 3. Further, the opposite ends of the connecting layer 71, the memory cell 5 and the connecting layer 72 in the direction of length are located outside the magnetic circuits 6 and 7.

In the eighth embodiment, the opposite ends of the memory cell 5 in the direction of length protrude from the magnetic circuits 6 and 7. Thus, the distance between the memory cell and each of the magnetic circuits depends on the thickness of a corresponding one of the connecting layers 71 and 72. Therefore, the eighth embodiment provides substantially the same advantages as the sixth embodiment.

Further, in the eighth embodiment, the memory cell 5 is provided at an angle with the first and second write wiring 2 and 3. The advantages obtained from such a structure will be described below.

First, conventionally the memory cell 5 is arranged so that its direction of length coincides with the direction of the first write wiring 2. In writing information into a selected memory cell, two magnetic fields are generated by the write wiring 2 and 3 associated with that selected memory cell. A composite magnetic field resulting from these magnetic fields is applied to the memory cell at an angle to reverse the direction of magnetization of the recording layer 104.

In contrast, in the structure shown in FIGS. 35, 36A and 36B, magnetic fields generated by the write wiring 2 and 3 will mainly pass through portions proximate to the memory cell 5 and the magnetic circuits 6 and 7. In the proximity of the memory cell 5, therefore, the magnetic fields are formed along the direction of the cell length. As a result, information is written into a cell by the two magnetic fields oriented in the same direction. That is, this approach differs from the conventional one by which a composite magnetic field of two magnetic fields is generated at an angle with respect to the memory cell. For this reason, it becomes easy to generate a magnetic field only to a desired memory cell. Thus, it becomes possible to prevent a memory cell adjacent to a selected memory cell from being written into by mistake and to increase information retention characteristic.

In the eighth embodiment, it is required to change the direction of current flow in each of the write wiring 2 and 3 when data to be written into memory cells is changed from "0" to "1" or vice versa.

Ninth Embodiment

Figure 37:
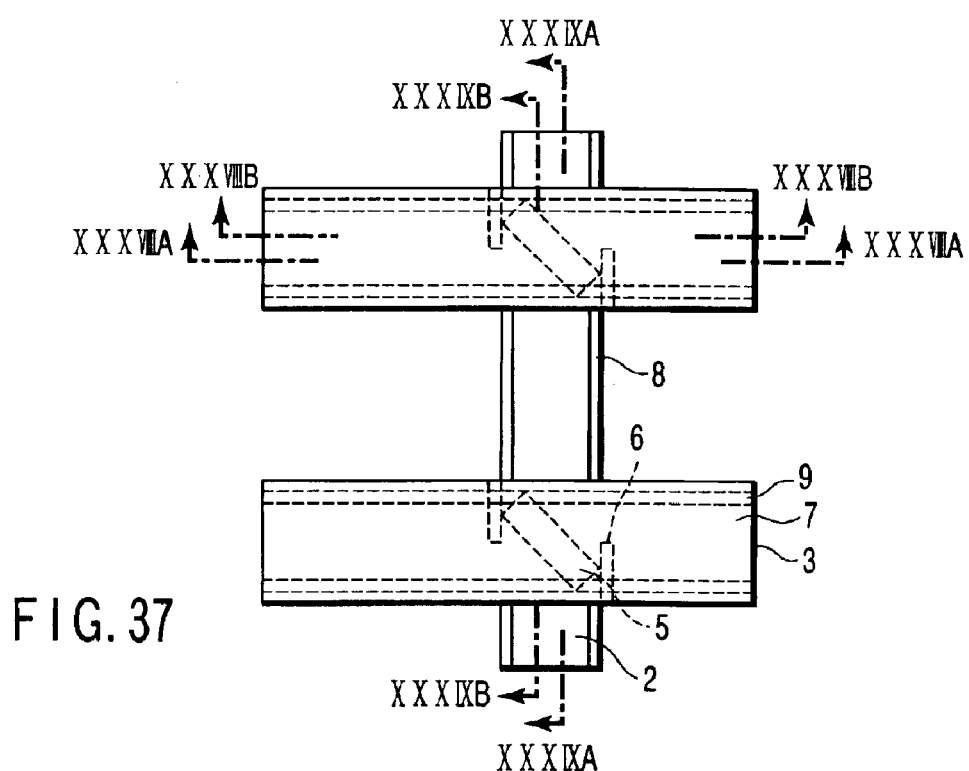
FIG. 37 is a schematic plan view of a magnetic memory device according to a ninth embodiment of the present invention.

FIG. 37 is a schematic plan view of a magnetic memory device according to a ninth embodiment of the present invention. FIGS. 38A and 38B are schematic sectional views taken along lines XXXVIIIA—XXXVIIIA and XXXVIIIB—XXXVIIIB in FIG. 37. FIGS. 39A and 39B are schematic sectional views taken along lines XXXIXA—XXXIXA and XXXIXB—XXXIXB in FIG. 37.

In FIG. 38A, the portion of the magnetic circuit 7 located in front of the second write wiring 3 is illustrated by a dashed-and-dotted line. In FIG. 38B, the portion of the magnetic circuit 7 located behind the second write wiring 3 is illustrated by a broken line. Likewise, in FIGS. 39A and 39B, the portions of the magnetic circuit 6 located in front of and behind the first write wiring 2 are illustrated by a dashed-and-dotted line and a broken line, respectively.

As shown in FIGS. 37, 38A, 38B, 39A and 39B, the memory cell 5 is provided, as in the eighth embodiment, in a direction different from the direction in which each of the first and second write wiring 2 and 3 extends. This direction is determined in the same manner as with the eighth embodiment. The ends (corners) of the memory cell 5 are located above and below the magnetic circuits 6 and 7.

The side portions of the magnetic circuit 6 above which the corners of memory cells are not located are removed in the form of a notch as in the first embodiment.

The side portions of the magnetic circuit 7 under which the corners of memory cells are not located are removed in the form of a notch as in the third embodiment. In other respects, the ninth embodiment remains unchanged from the first embodiment.

The ninth embodiments will provide substantially the same advantages as the first and eighth embodiments.

Although the embodiments of the present invention have been described in terms of either of the select transistor type and the cross-point type, both the types may be applied to each embodiment.

Although the embodiments have been described as the first write wiring 2 being located below the second wiring layers 3, the latter may be located below the former.

The embodiments are configured such that each wiring layer has a barrier metal. However, this is not essential to the present invention. To fulfill the function of each embodiment, it does not matter whether the barrier metal is provided or not. Furthermore, an additional barrier metal (second barrier metal) may be provided around the magnetic circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
   first and second magnetoresistance elements provided apart from each other in a first direction and recording information;
   a first wiring provided along the first direction and applying a magnetic field to the first and second magnetoresistance elements; and
   a first magnetic circuit provided along a side of the first wiring, the first magnetic circuit having a notch in its portion between the first and second magnetoresistance elements.

2. The device according to claim 1, wherein the depth of the notch of the first magnetic circuit is set to equal to or more than half of a smaller distance selected from the group consisting of a distance between the first magnetic circuit and the first magnetoresistance element and a distance between the first magnetic circuit and the second magnetoresistance element.

3. The device according to claim 1, further comprising
   a third magnetoresistance element provided apart from the first magnetoresistance element in a second direction different from the first direction, the third magnetoresistance element recording information; and
   a second wiring provided along the second direction and applying a magnetic field to the first and third magnetoresistance elements.

4. The device according to claim 3, wherein the axis of easy magnetization of the first, second and third magnetoresistance elements is oriented along the second direction.

5. The device according to claim 3, further comprising a second magnetic circuit provided along a side of the second wiring, the second magnetic circuit having a notch in its portion between the first and third magnetoresistance elements.

6. The device according to claim 5, wherein the depth of the notch of the second magnetic circuit is set to equal to or more than half of a smaller distance selected from the group consisting of a distance between the second magnetic circuit and the first magnetoresistance element and a distance between the second magnetic circuit and the third magnetoresistance element.

7. A magnetic memory device comprising:
   first and second magnetoresistance elements provided apart from each other in a first direction and recording information;
   a third magnetoresistance element provided apart from the first magnetoresistance element in a second direction different from the first direction and recording information, each of the first, second and third magnetoresistance elements oriented along the third direction different from the first and second directions;
   a first wiring provided along the first direction and applying a magnetic field to the first and second magnetoresistance elements;
   a second wiring provided along the second direction and applying a magnetic field to the first and third magnetoresistance elements;
   a first magnetic circuit provided along a side of the first wiring, the first magnetic circuit having a notch in its portion between the first and second magnetoresistance elements; and
   a second magnetic circuit provided along a side of the second wiring, the second magnetic circuit having a notch in its portion between the first and third magnetoresistance elements.

8. The device according to claim 1, wherein the magnetoresistance element comprises:
   a first magnetic layer the direction of magnetization of which is fixed;
   a nonmagnetic layer which faces the first magnetic layer; and
   a second magnetic layer which faces an opposite surface of the nonmagnetic layer from the first magnetic layer and stores information.

9. The device according to claim 1, wherein the magnetoresistance element comprises:
   a first magnetic layer the direction of magnetization of which is fixed,
   a first nonmagnetic layer which faces the first magnetic layer;
   a second magnetic layer which faces an opposite surface of the first nonmagnetic layer from the first magnetic layer and stores information;
   a second nonmagnetic layer which faces an opposite surface of the second magnetic layer from the first nonmagnetic layer; and
   a third magnetic layer which faces an opposite surface of the second nonmagnetic layer from the second magnetic layer and the direction of magnetization of which is fixed.

10. The device according to claim 1, wherein a wiring selected from the group consisting of the first and second wiring is electrically connected with the magnetoresistance element and has a function of reading information from the magnetoresistance element.

11. The device according to claim 1, further comprising a transistor connected with the magnetoresistance element and selecting it.

12. A magnetic memory device comprising:
   a magnetoresistance element storing information and comprising a first magnetic layer, a nonmagnetic layer and a second magnetic layer, the first magnetic layer facing a first wiring, having its end located outside a first magnetic circuit and recording information, the nonmagnetic layer facing the opposite surface of the first magnetic layer from the first wiring, the second magnetic layer facing the opposite surface of the nonmagnetic layer from the first magnetic layer, having the direction of magnetization fixed and being smaller than the first magnetic layer in size in a plane along a surface of the magnetoresistance element which faces the first wiring;
   the first wiring provided along a first direction and applying a magnetic field to the magnetoresistance element; and
   the first magnetic circuit provided along a side of the first wiring, the magnetoresistance element having its end located outside the first magnetic circuit.

13. A magnetic memory device comprising:

a magnetoresistance element storing information and comprising a first magnetic layer, a nonmagnetic layer and a second magnetic layer, the first magnetic layer facing a first wiring, having its end located outside a first magnetic circuit and recording information, the nonmagnetic layer facing the opposite surface of the first magnetic layer from the first wiring, the second magnetic layer facing the opposite surface of the nonmagnetic layer from the first magnetic layer, having the direction of magnetization fixed and being smaller than the first magnetic layer in size in a plane along a surface of the magnetoresistance element which faces the first wiring;

the first wiring provided along a first direction and applying a magnetic field to the magnetoresistance element;

the first magnetic circuit provided along a side of the first wiring, the magnetoresistance element having its end located outside the first magnetic circuit; and a second wiring provided in a second direction different from the first direction and applying a magnetic field to the magnetoresistance element.

14. A magnetic memory device comprising:

a magnetoresistance element storing information;

a first wiring provided along a first direction and applying a magnetic field to the magnetoresistance element; and a first magnetic circuit provided along opposite two side surfaces of the first wiring and along a surface of the first wiring opposite to a surface which faces the magnetoresistance element, the magnetoresistance element having its end located outside the first magnetic circuit.

15. A magnetic memory device comprising:

a magnetoresistance element storing information;

a first wiring provided along a first direction and applying a magnetic field to the magnetoresistance element;

a first magnetic circuit provided alone a side of the first wiring, the magnetoresistance element having its end located outside the first magnetic circuit;

a connecting layer which contacts the magnetoresistance element and the first wiring between the magnetoresistance element and the first wiring and which is smaller than the magnetoresistance element in size in a plane along a surface of the magnetoresistance element; and an insulating interlayer which is provided around the connecting layer and which contacts the magnetoresistance element and the first wiring between the magnetoresistance element and the first wiring.

* * * * *